(12) United States Patent
Ueno et al.

(10) Patent No.: US 11,709,213 B2
(45) Date of Patent: Jul. 25, 2023

(54) METHOD FOR DESIGNING GRADIENT COIL AND GRADIENT COIL

(71) Applicants: KYOTO UNIVERSITY, Kyoto (JP); KYOTO FUTURE MEDICAL INSTRUMENTS INC., Kyoto (JP)

(72) Inventors: Tomohiro Ueno, Kyoto (JP); Hector Sanchez Lopez, Kyoto (JP)

(73) Assignees: KYOTO UNIVERSITY, Kyoto (JP); KYOTO FUTURE MEDICAL INSTRUMENTS INC., Kyoto (JP)

( * ) Notice: Subject to any disclaimer, the term of this patent is extended or adjusted under 35 U.S.C. 154(b) by 0 days.

(21) Appl. No.: 17/785,543

(22) PCT Filed: Nov. 25, 2020

(86) PCT No.: PCT/JP2020/043837
§ 371 (c)(1),
(2) Date: Jul. 1, 2022

(87) PCT Pub. No.: WO2021/124817
PCT Pub. Date: Jun. 24, 2021

(65) Prior Publication Data
US 2023/0039826 A1 Feb. 9, 2023

(30) Foreign Application Priority Data

Dec. 19, 2019 (JP) .................. 2019-229073

(51) Int. Cl.
*G01R 33/34* (2006.01)
*G01R 33/385* (2006.01)

(52) U.S. Cl.
CPC ........... *G01R 33/34* (2013.01); *G01R 33/385* (2013.01)

(58) Field of Classification Search
CPC .............................. G01R 33/34; G01R 33/385
See application file for complete search history.

(56) References Cited

U.S. PATENT DOCUMENTS 4,737,716 A * 4/1988 Roemer ............. G01R 33/4215
324/318
5,485,087 A 1/1996 Morich et al.
(Continued)

FOREIGN PATENT DOCUMENTS

JP H0856934 A 3/1996
JP 2009538202 A 11/2009
(Continued)

OTHER PUBLICATIONS

International Search Report dated Jan. 19, 2021 for International Application No. PCT/JP2020/043837, 4 pages with English translation.
(Continued)

*Primary Examiner* — G. M. A Hyder
(74) *Attorney, Agent, or Firm* — MH2 Technology Law Group, LLP

(57) ABSTRACT

While the size of a coil is maintained, the performance of the coil is improved. A method for designing a gradient coil includes the step of determining performance value evaluation points between a plurality of coils disposed so as to face each other, and determining a stream function on the basis of the performance value evaluation points and the target field method so as to decrease the value of a polynomial evaluation function containing a term of a simple sum of sizes of current density distribution in coil planes; and the step of disposing a continuous current pathway in the coil planes on the basis of contours of the determined stream function.

17 Claims, 14 Drawing Sheets

(56) References Cited

U.S. PATENT DOCUMENTS

2005/0046532 A1* 3/2005 Dodd ............... G01R 33/385
335/299
2010/0268514 A1* 10/2010 Liu ............... G01R 33/385
703/2

FOREIGN PATENT DOCUMENTS

| JP | 2012000222 A | 1/2012 |
|----|--------------|---------|
| JP | 2018519863 A | 7/2018 |
| WO | 2007140089 A2 | 12/2007 |
| WO | 2016183284 A1 | 11/2016 |

OTHER PUBLICATIONS

Dardo Tomasi, "Stream Function Optimization for Gradient Coil Design", Magnetic Resonance in Medicine, 2001, vol. 45, No. 3, pp. 505-512.

Xin et al., "Inverse design of an organ-oriented RF coil for open, vertical-field, MR-guided, focused ultrasound surgery", Magnetic Resonance Imaging, 2012, vol. 30, No. 10, pp. 1519-1526.

Foo et al., "Lightweight, compact, and high-performance 3T MR system for imaging the brain and extremeties", Magnetic Resonance in Medicine, 2018, pp. 1-14.

Lemdiasov et al., "A Stream Function Method for Gradient Coil Design", Concepts in Magnetic Resonance Part B (Magnetic Resonance Engineering), 2005, vol. 26B, No. 1, pp. 67-80.

\* cited by examiner (A)

(B)

PRIOR ART

US 11,709,213 B2

METHOD FOR DESIGNING GRADIENT COIL AND GRADIENT COIL

CROSS-REFERENCE TO RELATED APPLICATIONS

This application is a U.S. National Stage application of International Application No. PCT/JP2020/043837 filed 25 Nov. 2020, which claims priority to Japanese Application No. 2019-229073 filed 19 Dec. 2019, the entire disclosures of which are hereby incorporated by reference in their entireties.

TECHNICAL FIELD

The present invention relates to a method for designing a coil, more specifically to a gradient coil typically used in magnetic resonance imaging, and a method for designing such a gradient coil.

BACKGROUND ART

Magnetic resonance imaging (MRI), which uses nuclear magnetic resonance (NMR) to image in vivo information, is known in the medical field and other fields.

An MRI system based on magnetic resonance imaging is equipped with gradient coils that generate a gradient magnetic field that changes spatially and linearly. Hydrogen atoms in the form of water ($H_2O$) are abundant in the living body, and the resonance frequency of a nuclear magnetic resonance signal emitted from a proton, which is the nucleus of hydrogen, varies spatially linearly due to the gradient magnetic field. This adds location information to the signal received by an RF receiver coil for signal detection, and then adds the location information to the region of interest (ROI) of the living body to be imaged. Typically, a gradient coil is composed of one axially gradient coil (Z-axis direction) and two cross-sectionally gradient coils (directions X and Y), each orthogonal to the axially gradient coil, and 3D location information is added to the region of interest.

FIG. 15 is a partial cross-sectional view of an illustrative structure of the MRI system for head imaging disclosed in NPL 1, listed below. In FIG. 15, reference numeral 109 denotes a gradient coil for local imaging, reference numeral 200 denotes a main magnet for applying magnetostatic field $B_0$ that defines the quantization axis, and reference numeral 300 denotes an RF-receiving coil for signal detection. In magnetic resonance imaging, it is known that when an image is captured in a relatively small region of interest, for example, the head or extremities of the human body, gradient coils for local imaging instead of gradient coils for whole-body imaging, as shown in FIG. 15, are used. For example, PTL 1 and 2, listed below, disclose gradient coils for local imaging used in MRI systems.

The gradient coils are designed by using a technique such as the finite element method or the target field method. For example, NPL 2, listed below, discloses a method for designing gradient coils by using the target field method.

The gradient magnetic field is also referred to as a "gradient field," and the gradient coil is also referred to as a "gradient field coil."

CITATION LIST

Patent Literature

PTL 1: JPH08-56934A
PTL 2: JP2009-538202A

Non-Patent Literature

NPL 1: Foo TKF, Laskaris E, Vermilyea M, et al. "Lightweight, compact, and high-performance 3T MR system for imaging the brain and extremities," Magnetic Resonance in Medicine, 2018; 00:1-14. https://doi.org/10.1002/mrm.27175

NPL 2: Rostislav A. Lemdiasov, Reinhold Ludwig, "A Stream Function Method for Gradient Coil Design," Concepts in Magnetic Resonance Part B (Magnetic Resonance Engineering), Vol. 26B(1) 67-80 (2005). https://doi.org/10.1002/cmr.b.20040

SUMMARY OF INVENTION

Technical Problem

The indices that represent the performance of gradient coils include efficiency, inductance, and resistance values, and the indices that represent the performance of a gradient magnetic field generated by a gradient coil include the uniformity and linearity of the magnetic field and a rollover value. For example, an improved uniformity of the magnetic field leads to an enhanced resolution of an image captured by an MRI system. However, there is a tradeoff between coil dimensions and coil performance. Improvement of the uniformity and linearity of gradient magnetic fields results in large dimensions of the coils. Larger coils are not suitable for gradient coils for local imaging.

For example, increasing the number of coil turns to improve efficiency increases the strength of the gradient magnetic field, thus improving the resolution of a captured image. Increasing the number of coil turns also improves the uniformity of the magnetic field. However, increasing the number of coil turns increases the quantity of heat generated by the coil due to an increase in the inductance and resistance value, and thereby decreases the slew rate, which is the speed at which the coil operates when an image is captured by an MRI system. Increasing the number of coil turns also limits the operating time of the MRI system due to the increased quantity of heat generated by the coil, and also decreases the operating speed of the MRI system and thus increases the interval of imaging time. As a result, when images of a living subject whose conditions vary over time are continuously captured on a time-series basis with an MRI system equipped with coils that have a size increased by increasing the number of turns, for example, for the purpose of elucidating the brain function, the resolution of the captured images is reduced. There is demand for improving the performance of coils while maintaining the dimensions of coils at the current levels to improve the resolution of captured images.

The present invention provides a method for designing a gradient coil that improves coil performance while maintaining the dimensions of the coil at the current levels, and also provides a gradient coil.

Solution to Problem

In the course of extensive research, the present inventors found that the object can be achieved by determining the stream function so as to decrease the value of a polynomial evaluation function containing the term of a simple sum of the sizes of current density distribution in the coil planes on the basis of the target field method.

Specifically, the present invention to achieve the object above includes, for example, the following subject matter.

Item 1
 A method for designing a gradient coil, comprising
  the step of determining performance value evaluation points between a plurality of coils disposed so as to face each other, and determining a stream function on the basis of the performance value evaluation points and a target field method so as to decrease a value of a polynomial evaluation function containing a term of a simple sum of sizes of current density distribution in coil planes, and
  the step of disposing a continuous current pathway in the coil planes on the basis of contours of the determined stream function.

Item 2.
 The method for designing a gradient coil according to Item 1, wherein the step of disposing a continuous current pathway in the coil planes disposes a continuous first through-groove that defines a region of the continuous current pathway between the contours in the coil planes.

Item 3.
 The method for designing a gradient coil according to Item 2, wherein the step of disposing a continuous current pathway in the coil planes further disposes a second through-groove that intersects with the continuous first through-groove in the coil planes, and a third through-groove extending from an end of each coil toward the continuous first through-groove or the second through-groove in the coil planes.

Item 4.
 The method for designing a gradient coil according to Item 1, wherein the step of disposing a continuous current pathway in the coil planes disposes a strand conductor that functions as the continuous current pathway along the contours in the coil planes.

Item 5.
 The method for designing a gradient coil according to any one of Items 1 to 4, wherein the performance value evaluation points are set between the plurality of coils disposed so as to face each other, the plurality of coils being curved plate-shaped.

Item 6.
 The method for designing a gradient coil according to Item 5, wherein the performance value evaluation points are each set at a position offset from a center of a cylindrical void defined by the plurality of curved plate-shaped coils along a long axis of the cylindrical void toward an end of the void.

Item 7.
 A gradient coil comprising a plurality of coils disposed so as to face each other, wherein the coils each comprise a continuous current pathway in coil planes, and a position of the continuous current pathway is determined on the basis of contours of a stream function determined on the basis of a target field method so as to decrease a value of a polynomial evaluation function containing a term of a simple sum of sizes of current density distribution in the coil planes.

Item 8.
 The gradient coil according to Item 7, wherein the coils each comprise a continuous first through-groove that defines a region of the continuous current pathway between the contours in the coil planes.

Item 9.
 The gradient coil according to Item 8, wherein the coils each further comprise
  a second through-groove that intersects with the continuous first through-groove, and
  a third through-groove extending from an end of each coil toward the continuous first through-groove or the second through-groove.

Item 10.
 The gradient coil according to Item 7, wherein the coils each comprise a strand conductor that functions as the continuous current pathway along the contours in the coil planes.

Item 11.
 The gradient coil according to any one of Items 7 to 10, wherein the plurality of coils disposed so as to face each other are curved plate-shaped.

Item 12.
 The gradient coil according to Item 11, comprising a linear region at a position offset from a center of a cylindrical void toward an end of the void along a long axis of the cylindrical void, the linear region being a region in which a magnetic field intensity linearly changes, the cylindrical void being formed from the plurality of curved plate-shaped coils.

Item 13.
 The gradient coil according to Item 12,
 wherein
  the plurality of curved plate-shaped coils disposed so as to face each other constitute a cross-sectionally gradient coil that generates a gradient magnetic field in a transverse section perpendicular to the long axis,
  the continuous current pathway defines
  a substantially rectangular region that is disposed in a center of the coil planes, that is symmetrical with respect to the long axis, and that does not have the continuous current pathway, and
  a substantially trapezoidal region that is disposed along the long axis together with the substantially rectangular region in the coil planes, that is symmetrical with respect to the long axis, and that does not have the continuous current pathway, and
  the substantially rectangular region is located, among a short side and a long side of the substantially trapezoidal region, on a side of the long side.

Item 14.
 The gradient coil according to Item 13,
 wherein
  the substantially rectangular region has
  a dimension in a direction of the long axis within a range of 10% to 15% of a dimension of an outline surrounded by the continuous current pathway, and
  a dimension in a direction perpendicular to the long axis within a range of 16% to 22% of the dimension of the outline surrounded by the continuous current pathway,
  the substantially trapezoidal region has
  a dimension in the direction of the long axis within a range of 10% to 15% of the dimension of the outline surrounded by the continuous current pathway,
  a dimension of the short side in the direction perpendicular to the long axis within a range of 18% to 24% of the dimension of the outline surrounded by the continuous current pathway, and
  a dimension of the long side in the direction perpendicular to the long axis within a range of 31% to 37% of the dimension of the outline surrounded by the continuous current pathway.

Item 15.
 The gradient coil according to Item 14, wherein
 gradient magnetic field efficiency in the transverse section is within a range of 135 to 145 µT/m/A, inductance for direct current is within a range of 213 to 233 μH, and a resistance value for direct current is within a range of 80 to 90 mΩ.

Item 16.

The gradient coil according to any one of Items 12 to 15, further comprising a pair of axially gradient coils having a pair of continuous current pathways that generate a gradient magnetic field in the direction along the long axis, wherein the pair of axially gradient coils are disposed symmetrically with respect to a center of the linear region along the long axis, and a direction of current is opposite between the axially gradient coils, and the pair of continuous current pathways are disposed such that current density distribution along the long axis is bimodal at least in either one side or the other side of the center of the linear region.

Item 17.

The gradient coil according to Item 16, wherein an intensity of current density of a peak located far from the center of the linear region is 10 to 15 times an intensity of current density of a peak located closer to the center of the linear region in the current density distribution.

Advantageous Effects of Invention

The present invention provides a method for designing a gradient coil for increasing the performance of a coil while maintaining the size of the coil at the current levels, and provides a gradient coil.

Description of Embodiments

Figure 1:
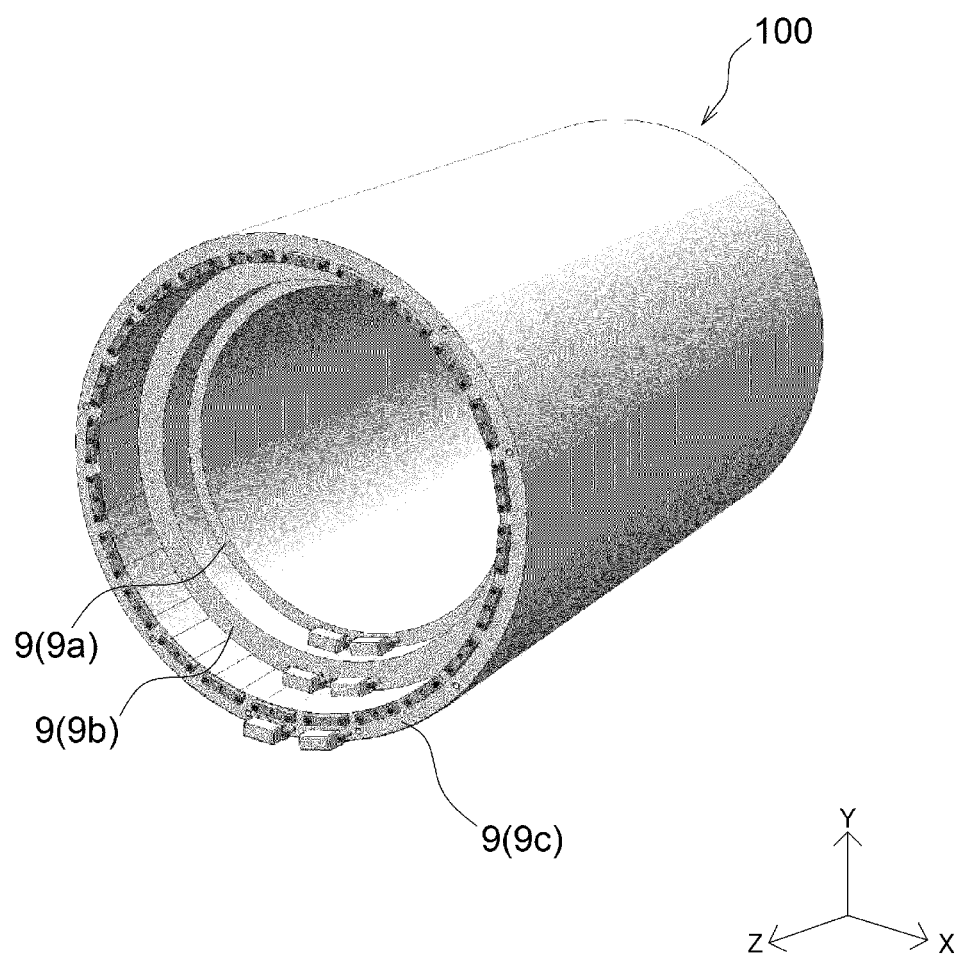
FIG. 1 shows a perspective view of a gradient coil according to an embodiment of the present invention.

The following describes an embodiment of the present invention in detail with reference to accompanying drawings. In the following description and drawings, the same numerical references indicate the same or similar components; thus, redundant explanations of the same or similar components are omitted.

Outline of the Invention

In the present invention, a gradient coil is designed based on the target field method. In the target field method, the magnetic field distribution that a coil intends to generate is given as a target, and the distribution of the current density in the coil plane is determined by working backward from the desired magnetic field distribution given as a target. In the present invention, the boundary element method is applied in dividing a region in the coil plane in the target field method. This gives a magnetic field distribution generated by a coil. The winding pattern of the coil is determined by the obtained distribution of current density. In the target field method, the distribution of current density is represented by a stream function.

If a position vector is r, the distribution of current density can be expressed by using a current density field J(r), which is a vector field. The current density field J(r) satisfies the conservation law of electric charge.

$$\vec{j}(\vec{r}) = \nabla \times (\varphi(\vec{r}) \cdot \vec{n}(\vec{r}))$$

Thus, the current density field J(r) can be expressed by using a stream function having a scalar value $\varphi(\vec{r})$ as follows.

$$\vec{j}(\vec{r}) = \nabla \times (\varphi(\vec{r}) \cdot \vec{n}(\vec{r}))$$

The vector n is a unit vector perpendicular to the surface on which current density is present. The winding pattern of a coil that represents current density is determined based on a contour of each predetermined step of the stream function. The winding pattern of a coil is determined as a continuous seamless current pathway arranged in the coil plane. The seamless current pathway can be made by forming a notch or a cutout with a predetermined width in a plate-shaped conductive member. Alternatively, the seamless current pathway can be made by using a strand conductor.

In an embodiment, performance value evaluation points are determined between a plurality of coils disposed so as to face each other, and a stream function is determined on the basis of the performance value evaluation points and the target field method. The stream function is determined so as to decrease the value of a polynomial evaluation function containing a term of a simple sum of the sizes of current density distribution in the coil plane. The continuous current pathway, which serves as a winding pattern of a coil, is disposed in the coil plane on the basis of the contours of the determined stream function.

In an embodiment, the gradient coil includes a plurality of coils disposed so as to face each other. The coils each include a continuous current pathway in the coil planes. The position of each continuous current pathway is determined on the basis of the contours of a stream function determined on the basis of the target field method. The stream function is determined so as to decrease the value of a polynomial evaluation function containing a term of a simple sum of the sizes of current density distribution in the coil planes.

In an embodiment, the region of the continuous current pathway is defined by a continuous first through-groove. The continuous first through-groove is disposed between contours of the stream function in the coil plane. The region present in between the first through-groove in the coil plane corresponds to the continuous current pathway. In an embodiment, each coil in the gradient coil includes the continuous first through-groove that defines the region of the continuous current pathway between contours of the stream function in the coil plane.

In an embodiment, a second through-groove and a third through-groove are further disposed in each coil plane. The second through-groove intersects with the continuous first through-groove. The third through-groove extends from an end of each coil toward the continuous first through-groove or the second through-groove. In an embodiment, each coil in the gradient coil further includes the second through-groove that intersects with the continuous first through-groove, and the third through-groove extending from an end of the coil toward the continuous first through-groove or the second through-groove.

In another embodiment, the continuous current pathway is defined by disposing a strand conductor along the contours of the stream function in the coil planes. In an embodiment, each coil included in the gradient coil includes a strand conductor that functions as a continuous current pathway along the contours of the stream function in the coil plane.

In an embodiment, performance value evaluation points are set between a plurality of curved plate-shaped coils disposed so as to face each other. In an embodiment, the gradient coil includes a plurality of curved plate-shaped coils disposed so as to face each other.

In an embodiment, performance value evaluation points are each set at a position offset from the center of a cylindrical void defined by a plurality of curved plate-shaped coils disposed so as to face each other along the long axis of the cylindrical void toward an end of the void. In an embodiment, the gradient coil includes a linear region in which a magnetic field intensity linearly changes at a position offset from the center of a cylindrical void formed from a plurality of curved plate-shaped coils disposed so as to face each other toward an end of the cylindrical void along the long axis of the cylindrical void.

In an embodiment, the plurality of curved plate-shaped coils disposed so as to face each other in the gradient coil constitute a cross-sectionally gradient coil. The cross-sectionally gradient coil generates a gradient magnetic field in the transverse section perpendicular to the long axis of the cylindrical void formed from the plurality of curved plate-shaped coils disposed so as to face each other. In the coil plane, the continuous current pathway defines a substantially rectangular region in which a continuous current pathway is not present and a substantially trapezoidal region in which a continuous current pathway is not present. The substantially rectangular region is disposed in the center of the coil plane, and the substantially trapezoidal region is disposed along the long axis of the void together with the substantially rectangular region in the coil plane. The substantially rectangular region is located, among the short side and the long side of the substantially trapezoidal region, on the side of the long side. The substantially rectangular region is symmetrical with respect to the long axis of the void, and the substantially trapezoidal region is also symmetrical with respect to the long axis of the void.

In an embodiment, the substantially rectangular region has a dimension in the direction of the long axis of the void within the range of 10% to 15% of the dimension of the outline surrounded by the continuous current pathway, and a dimension in the direction perpendicular to the long axis within the range of 16% to 22% of the dimension of the outline surrounded by the continuous current pathway. In an embodiment, the substantially trapezoidal region has a dimension in the direction of the long axis of the void within the range of 10% to 15% of the dimension of the outline surrounded by the continuous current pathway, a dimension of the short side in the direction perpendicular to the long axis within the range of 18% to 24% of the dimension of the outline surrounded by the continuous current pathway, and a dimension of the long side in the direction perpendicular to the long axis within the range of 31% to 37% of the dimension of the outline surrounded by the continuous current pathway.

In an embodiment, gradient magnetic field efficiency in the transverse section of the gradient coil is within the range of 135 to 145 µT/m/A, inductance for direct current is within the range of 213 to 233 µH, and the resistance value for direct current is within the range of 80 to 90 mΩ. In an embodiment, the rollover value from the center of the magnetic field is within the range of 135 to 155 mm.

In an embodiment, the gradient coil further includes a pair of axially gradient coils having a pair of continuous current pathways. The pair of axially gradient coils generate a gradient magnetic field in the direction along the long axis of a cylindrical void formed from a plurality of curved plate-shaped coils disposed so as to face each other. The pair of axially gradient coils are disposed symmetrically with respect to the center of the linear region along the long axis of the void, and the direction of current is opposite between the axially gradient coils. The pair of continuous current pathways are disposed such that current density distribution along the long axis of the void is bimodal at least in either one side or the other side of the center of the linear region.

In an embodiment, the intensity of current density of the peak located far from the center of the linear region is 10 to 15 times the intensity of current density of the peak located closer to the center of the linear region in the bimodal current density distribution.

In an embodiment, the gradient coil is, for example, incorporated into an MRI system for imaging information in a living subject for use. The phrase "living subject" refers to, for example, an organism such as a human body or an animal, or tissue collected from these organisms, and the living subject that is the target for image capturing does not have to be actually alive. The target for image capturing with an MRI system may be typically a substance that contains hydrogen atoms, or a substance that contains nuclides whose nuclear magnetic moment can be detected by using nuclear magnetic resonance.

Structure of Gradient Coil

FIG. 1 shows a perspective view of a gradient coil according to an embodiment of the present invention.

A gradient coil 100 according to an embodiment includes a first gradient coil for generating a gradient magnetic field in direction X of the transverse section, a second gradient coil for generating a gradient magnetic field in direction Y of the transverse section, and a third gradient coil for generating a gradient magnetic field in direction Z along the axis. The first gradient coil and the second gradient coil each function as a cross-sectionally gradient coil, and the third gradient coil function as an axially gradient coil. In this embodiment, the first to third gradient coils are disposed inside supports 9 (9a, 9b, 9c).

The gradient coil 100 includes a cylindrical first support 9a, a cylindrical second support 9b disposed outside the first support 9a, and a cylindrical third support 9c disposed outside the second support 9b. The first support 9a to the third support 9c are disposed substantially in a concentric pattern, and the first to the third gradient coils are each disposed inside any of these three supports 9. The material of the supports 9 preferably has low magnetic permeability, and more preferably non-magnetic properties.

The following describes the position of the first to the third gradient coils with reference to FIGS. 2 to 6. FIGS. 2 to 6 show a diagram for explaining the position of the first to the third gradient coils inside the supports 9 (9a, 9b, 9c), rather than a figure for accurately showing the dimensions of the supports 9.

Figure 2:
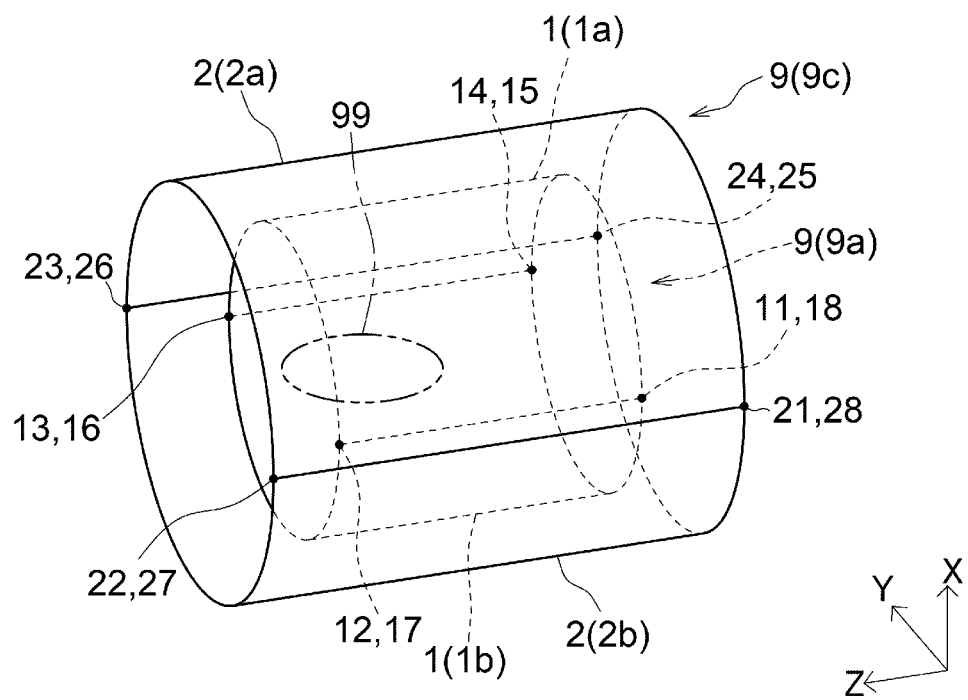
FIG. 2 shows a diagram for explaining a first gradient coil included in the gradient coil according to an embodiment of the present invention.
Figure 3:
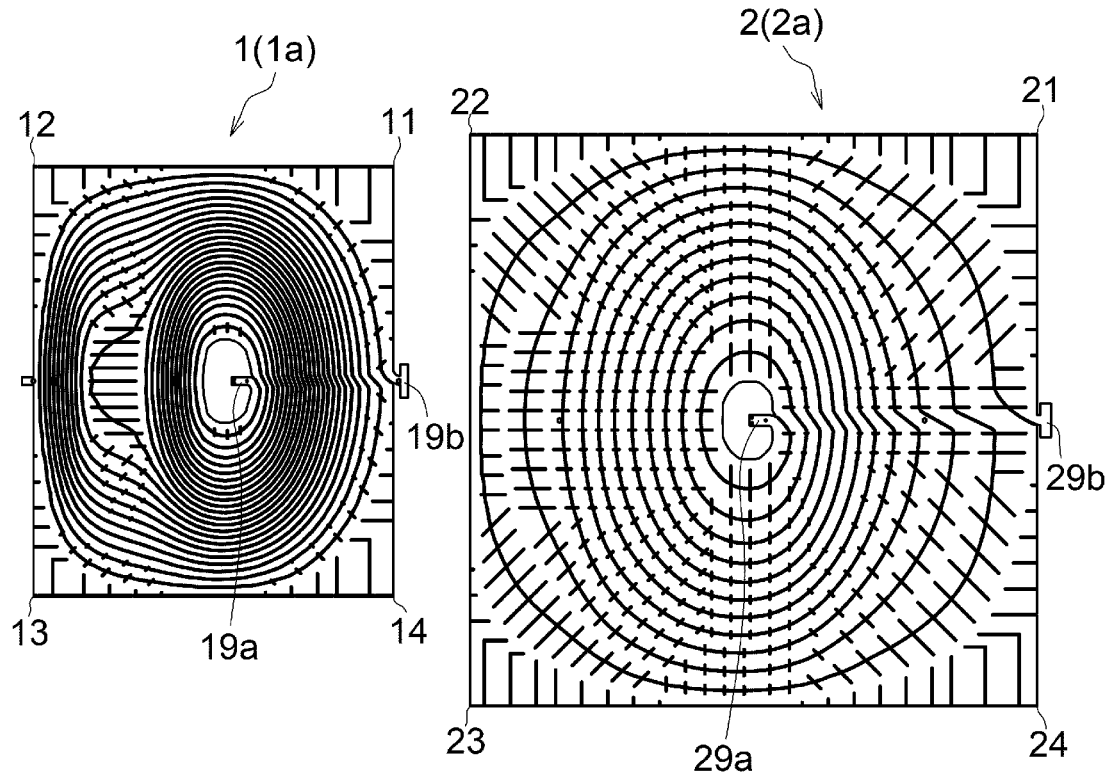
FIG. 3 shows diagrams for explaining the first gradient coil included in the gradient coil according to an embodiment of the present invention
Figure 3:
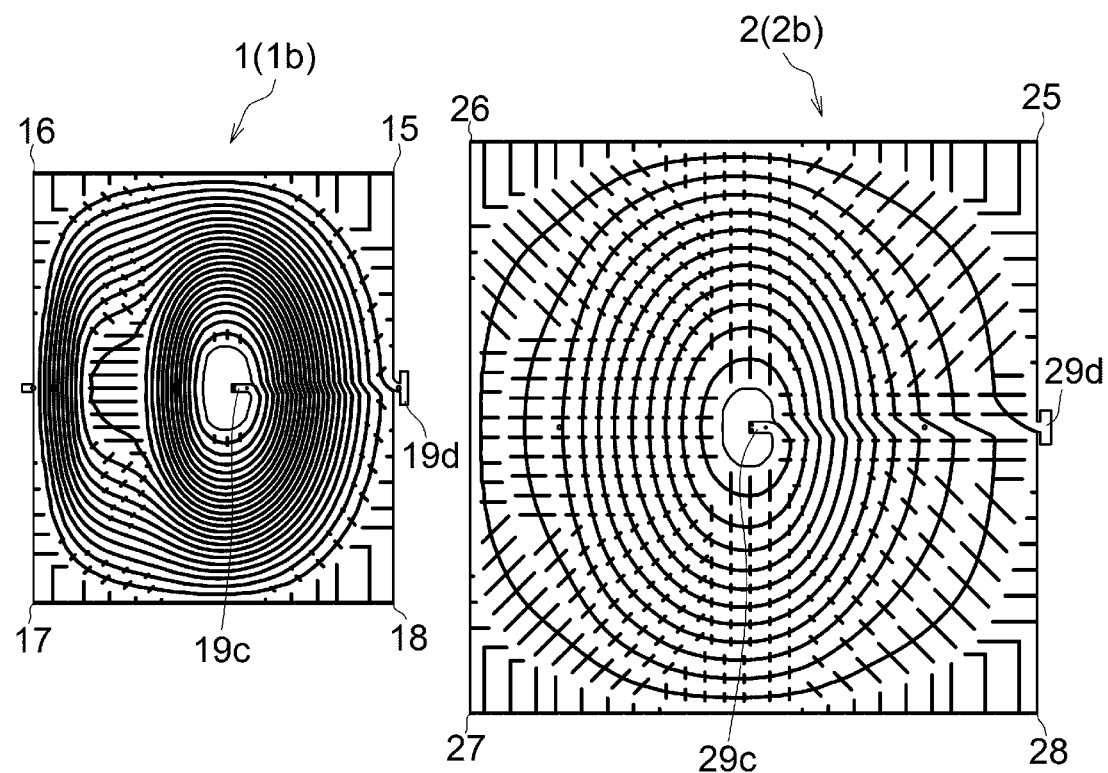

FIGS. 2 and 3 are both a diagram for explaining the first gradient coil included in the gradient coil according to an embodiment of the present invention.

The first gradient coil functions as a cross-sectionally gradient coil for generating a gradient magnetic field in direction X of the transverse section. The first gradient coil includes a first main coil 1 for generating a gradient magnetic field in the space of a linear region 99 in which the magnetic field intensity linearly changes and a first shield coil 2 for generating a shielding magnetic field for canceling a leakage field formed by the first main coil 1. In this embodiment, the first main coil 1 is disposed inside the first support 9a, and the first shield coil 2 is disposed inside the third support 9c. In this embodiment, the first main coil 1 and the first shield coil 2 are curved plate-shaped, and the first shield coil 2 is disposed outside the first main coil 1 in the circumferential direction.

The first main coil 1 includes a plurality of plate-shaped main coils 1a,1b disposed so as to face each other. The first shield coil 2 includes a plurality of plate-shaped shield coils 2a,2b disposed so as to face each other. The plurality of plate-shaped main coils 1a,1b and the plurality of plate-shaped shield coils 2a,2b each include a continuous current pathway in the coil planes. In this embodiment, the position of the continuous current pathway of each of the plurality of plate-shaped main coils 1a,1b is determined on the basis of contours of the stream function determined so as to decrease the value of a polynomial evaluation function containing a term of the simple sum of sizes of current density distribution in the coil planes. The method for determining the stream function is described later.

The first shield coil 2 generates a shielding magnetic field for canceling a leakage field formed by the first main coil 1; thus, the stream function can be determined by calculation, treating the first main coil 1 and the first shield coil 2 as an integrated single structure. The stream function for determining the position of the continuous current pathway in the plurality of plate-shaped main coils 1a,1b can be determined taking into consideration the plurality of plate-shaped shield coils 2a,2b.

A terminal 19a of the plate-shaped main coil 1a is connected to a terminal 29a of the plate-shaped shield coil 2a. A terminal 19b of the plate-shaped main coil 1a is connected to a terminal of an electric power source. A terminal 29b of the plate-shaped shield coil 2a is connected to a terminal 29d of the plate-shaped shield coil 2b. A terminal 19c of the plate-shaped main coil 1b is connected to a terminal 29c of the plate-shaped shield coil 2b. A terminal 19d of the plate-shaped main coil 1b is connected to the terminal of the electric power source. The terminal 29d of the plate-shaped shield coil 2b is connected to the terminal 29b of the plate-shaped shield coil 2a.

In the plate-shaped main coil 1a, the continuous current pathway is disposed in a spiral pattern with the terminal 19a as the starting point. Current flows from the terminal 19b to the terminal 19a in a spiral fashion on the continuous current pathway. In the plate-shaped shield coil 2a, current flows from the terminal 29a to the terminal 29b in a spiral fashion.

The same applies to the plate-shaped main coil 1b as to the plate-shaped main coil 1a. In the plate-shaped main coil 1b, the continuous current pathway is disposed in a spiral pattern with the terminal 19c as the starting point. Current flows from the terminal 19c to the terminal 19d in a spiral fashion on the continuous current pathway. In the plate-shaped shield coil 2b, current flows from the terminal 29d to the terminal 29c in a spiral fashion.

Figure 8:
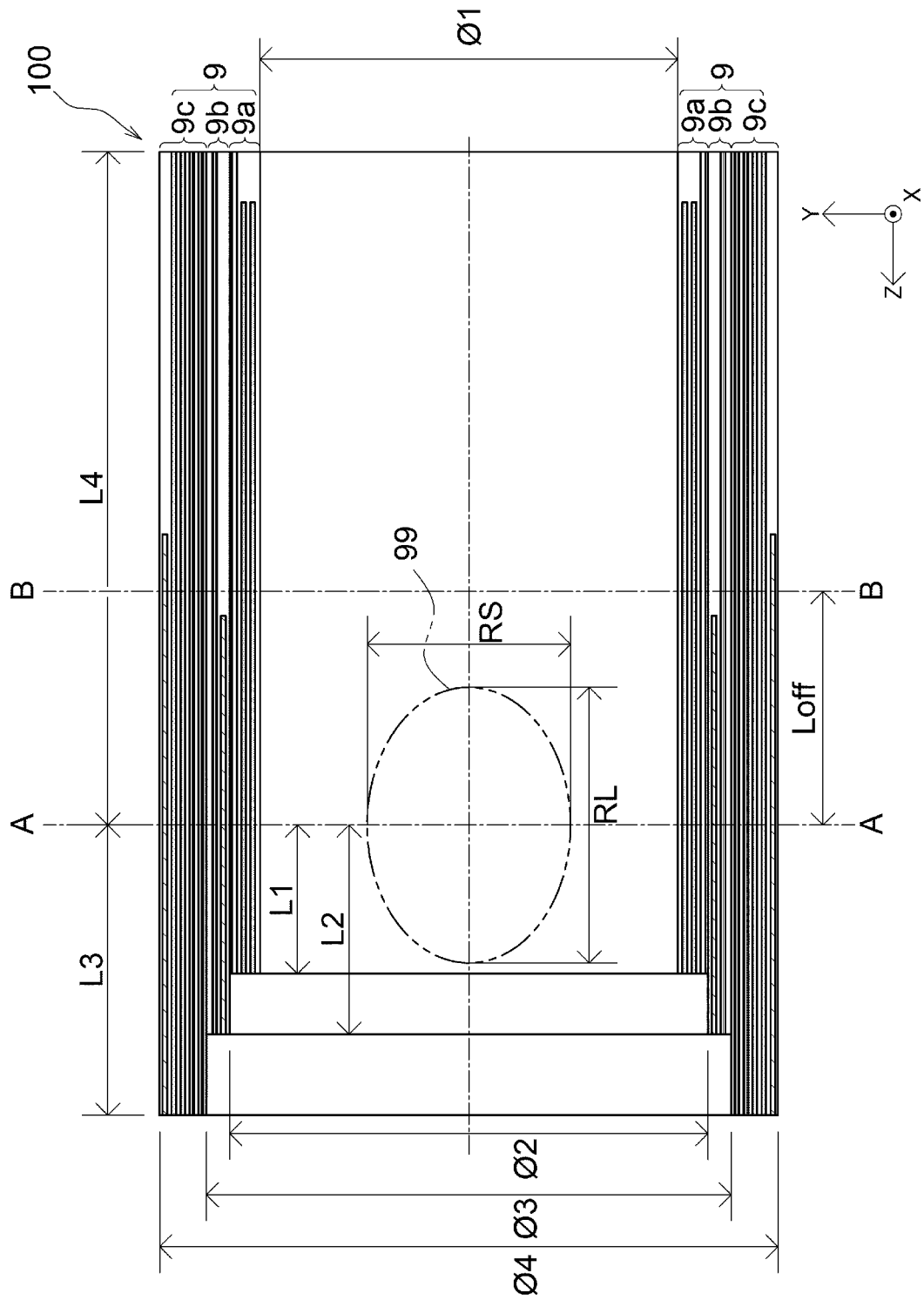
FIG. 8 shows a cross-sectional view taken by a Z-Y plane of the gradient coil according to an embodiment of the present invention.
Figure 9:
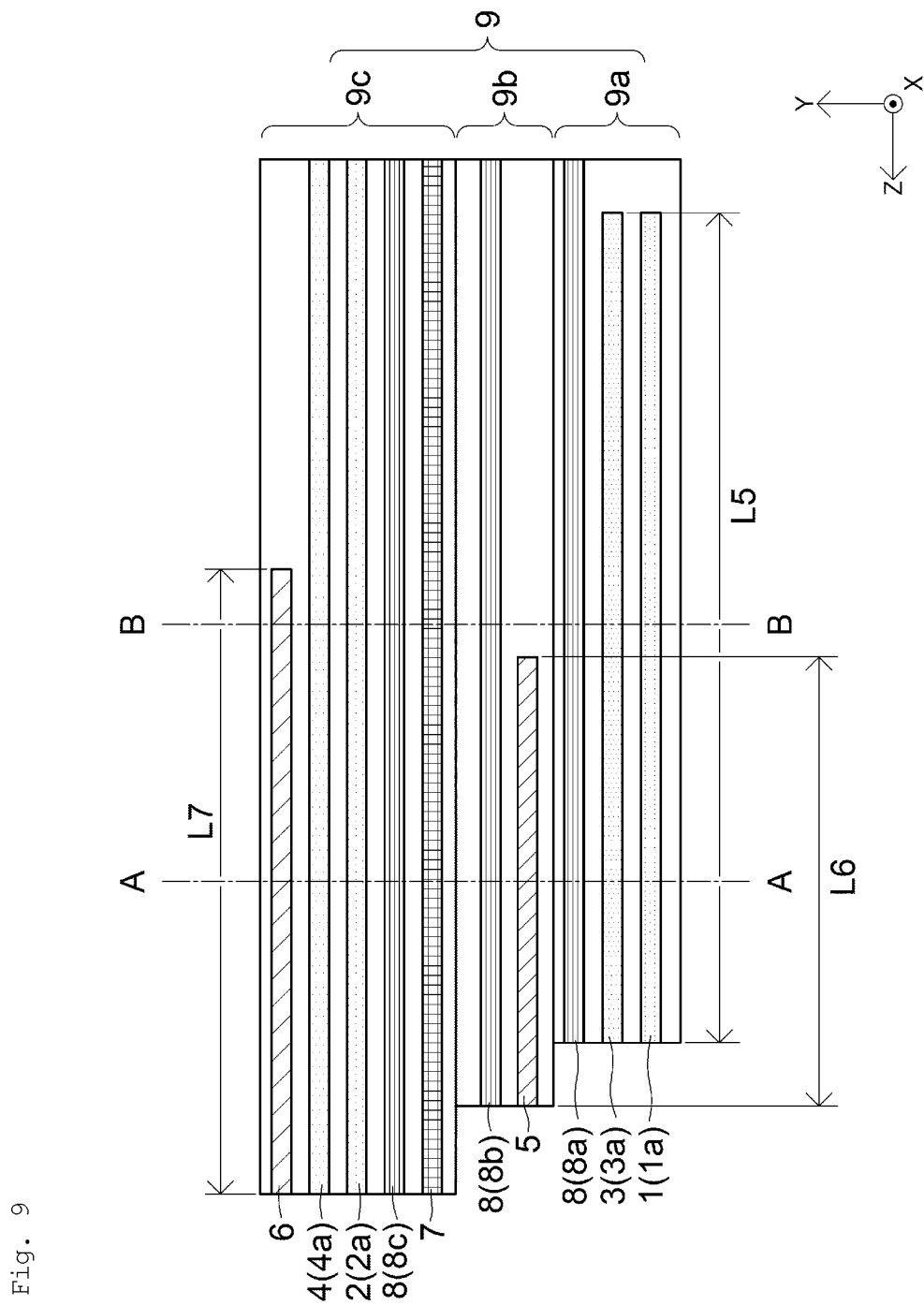
FIG. 9 shows a partially magnified view of the cross-sectional view shown in FIG. 8.

In this embodiment, the linear region 99 is disposed at a position offset from the center of a cylindrical void defined by the plurality of plate-shaped main coils 1a,1b to an end of the void along the long axis (Z axis) of the void, as shown in FIG. 2, and FIGS. 8 and 9, which are referenced later. In this embodiment, the plurality of plate-shaped main coils 1a,1b are asymmetric coils.

Figure 4:
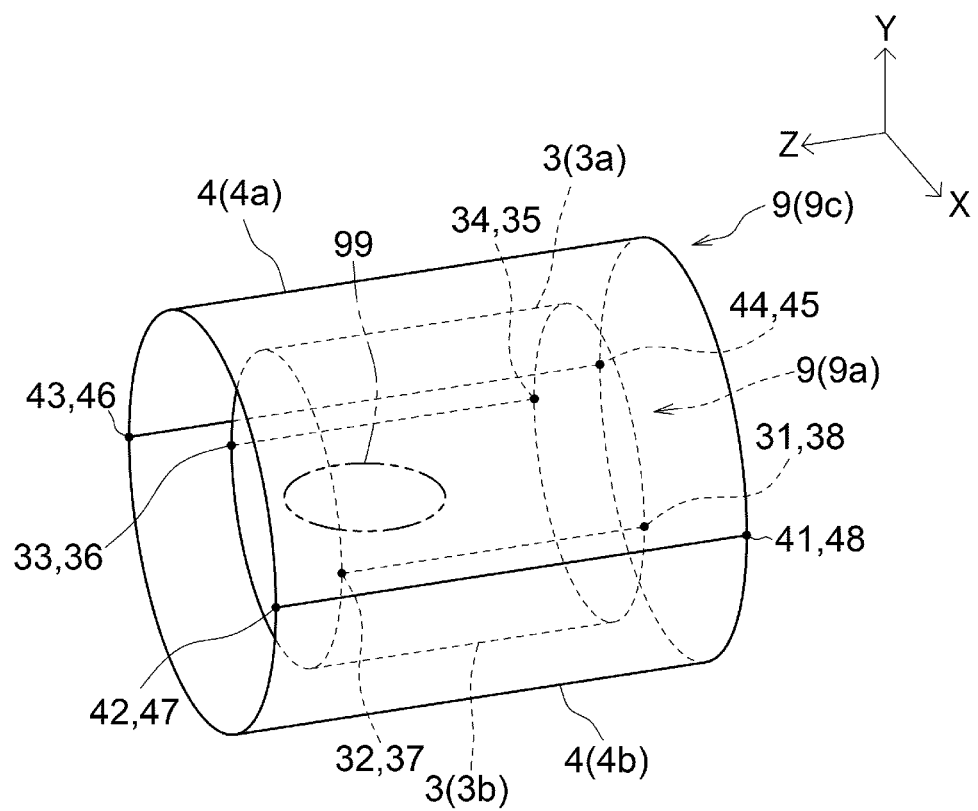
FIG. 4 shows a diagram for explaining a second gradient coil included in the gradient coil according to an embodiment of the present invention.
Figure 5:
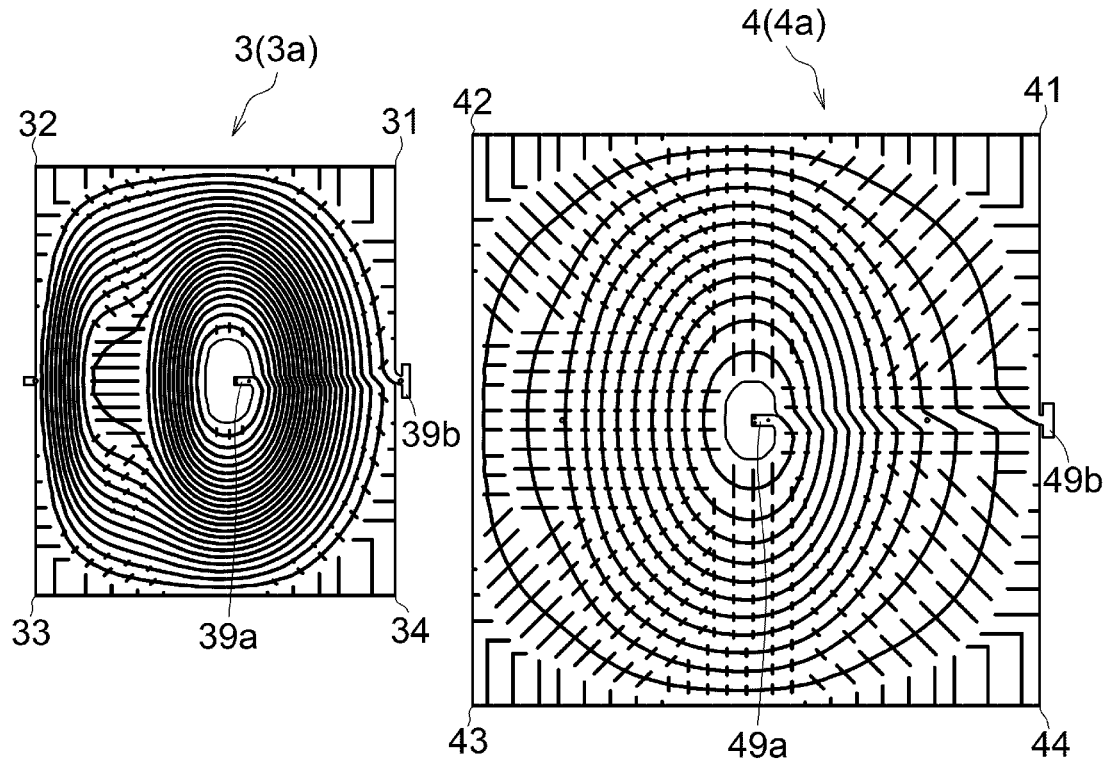
FIG. 5 shows diagrams for explaining the second gradient coil included in the gradient coil according to an embodiment of the present invention.
Figure 5:
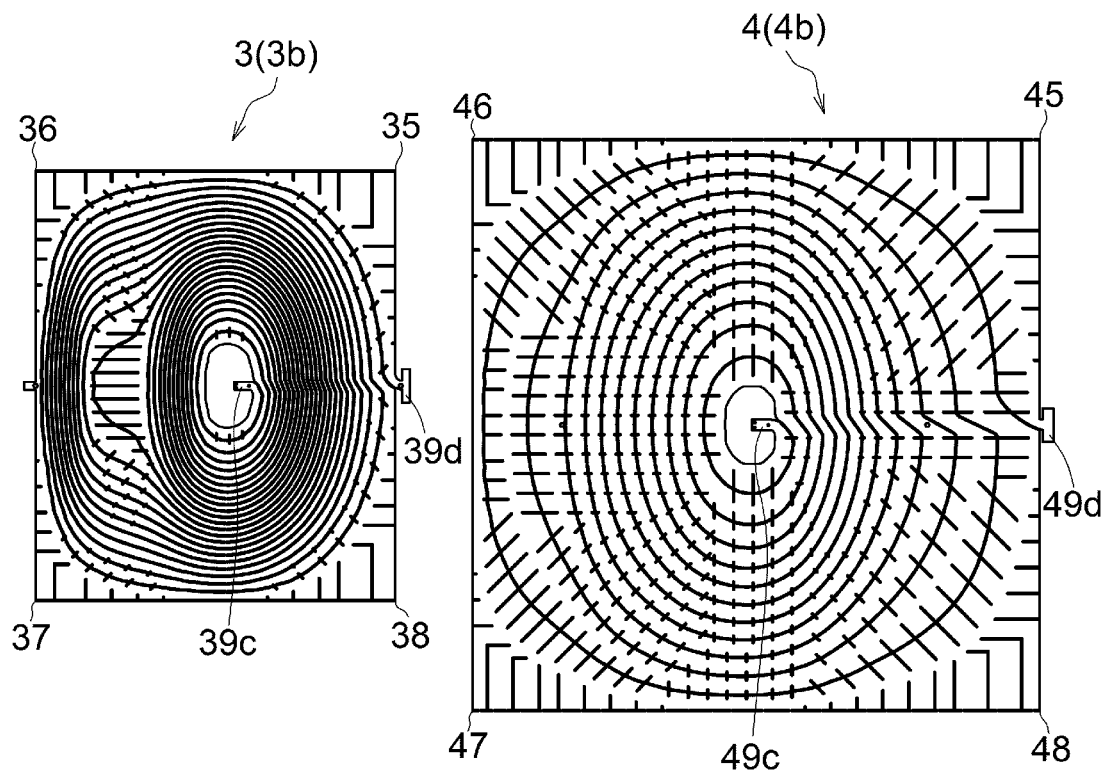

FIGS. 4 and 5 each show a diagram for explaining the second gradient coil included in the gradient coil according to an embodiment of the present invention.

The second gradient coil functions as a cross-sectionally gradient coil for generating a gradient magnetic field in direction Y of the transverse section. As with the first gradient coil, the second gradient coil includes a second main coil 3 for generating a gradient magnetic field in the space of the linear region 99 and a second shield coil 4 for generating a shielding magnetic field for canceling a leakage field formed by the second main coil 3. In this embodiment, the second main coil 3 is disposed inside the first support 9a, and the second shield coil 4 is disposed inside the third support 9c. In this embodiment, the second main coil 3 and the second shield coil 4 are curved plate-shaped, and the second shield coil 4 is disposed outside the second main coil 3 in the circumferential direction.

The second main coil 3 includes a plurality of plate-shaped main coils 3a,3b disposed so as to face each other. The second shield coil 4 includes a plurality of plate-shaped shield coils 4a,4b disposed so as to face each other. The plurality of plate-shaped main coils 3a,3b and the plurality of plate-shaped shield coils 4a,4b each include a continuous current pathway in the coil planes. In this embodiment, as with the plurality of plate-shaped main coils 1a,1b included in the first main coil 1, the position of the continuous current pathway of each of the plurality of plate-shaped main coils 3a,3b is determined on the basis of contours of the stream function determined so as to decrease the value of a polynomial evaluation function containing a term of the simple sum of sizes of current density distribution in the coil planes. The method for determining the stream function is also the same as for the first main coil 1 and the first shield coil 2. For the plurality of plate-shaped main coils 3a,3b, the stream function for determining the position of the continuous current pathway can be determined taking into consideration the plurality of plate-shaped shield coils 4a,4b.

A terminal 39a of the plate-shaped main coil 3a is connected to a terminal 49a of the plate-shaped shield coil 4a. A terminal 39b of the plate-shaped main coil 3a is connected to a terminal of an electric power source. A terminal 49b of the plate-shaped shield coil 4a is connected to a terminal 49d of the plate-shaped shield coil 4b. A terminal 39c of the plate-shaped main coil 3b is connected to a terminal 49c of the plate-shaped shield coil 4b. A terminal 39d of the plate-shaped main coil 3b is connected to the terminal of the electric power source. The terminal 49d of the plate-shaped shield coil 4b is connected to the terminal 49b of the plate-shaped shield coil 4a.

In the plate-shaped main coil 3a, the continuous current pathway is disposed in a spiral pattern with the terminal 39a as the starting point. Current flows in a spiral fashion from the terminal 39b to the terminal 39a on the continuous current pathway. In the plate-shaped shield coil 4a, current flows from the terminal 49a to the terminal 49b in a spiral fashion.

The same applies to the plate-shaped main coil 3b as to the plate-shaped main coil 3a. In the plate-shaped main coil 3b, the continuous current pathway is disposed in a spiral pattern with the terminal 39c as the starting point. Current flows from the terminal 39c to the terminal 39d in a spiral fashion on the continuous current pathway. In the plate-shaped shield coil 4b, current flows from the terminal 49d to the terminal 49c.

In this embodiment, as shown in FIG. 4, and FIGS. 8 and 9, which are referenced later, the linear region 99 is disposed at a position offset from the center of a cylindrical void defined by the plurality of plate-shaped main coils 3a,3b to an end of the void along the long axis (Z axis) of the void. In this embodiment, the plurality of plate-shaped main coils 3a,3b are asymmetric coils.

Figure 6:
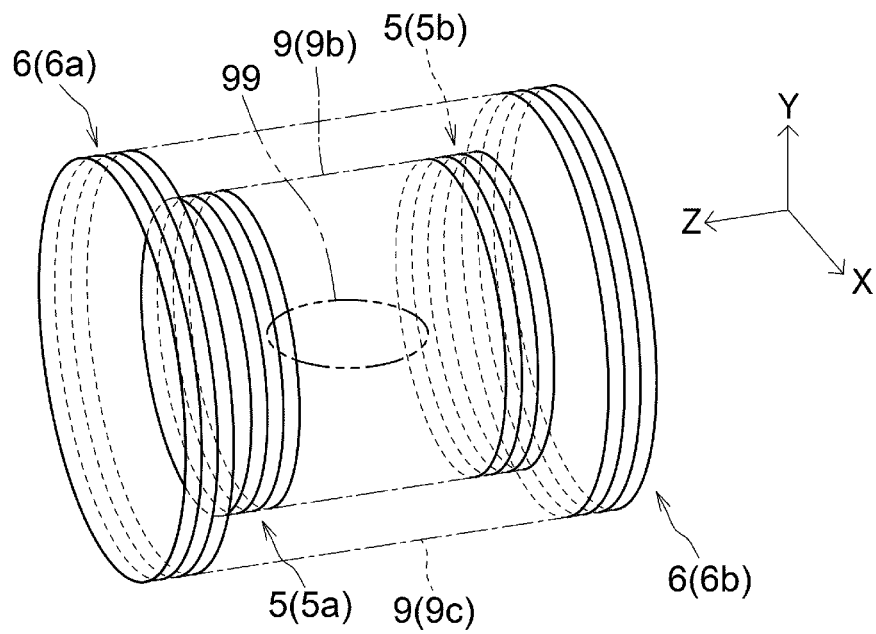
FIG. 6 shows a diagram for explaining a third gradient coil included in the gradient coil according to an embodiment of the present invention.

FIG. 6 shows a diagram for explaining the third gradient coil included in the gradient coil according to an embodiment of the present invention.

The third gradient coil functions as an axially gradient coil for generating a gradient magnetic field in direction Z along the axis. The third gradient coil includes a pair of third main coils 5 (5a,5b) for generating a gradient magnetic field in the space of the linear region 99 and a pair of third shield coils 6 (6a,6b) for generating a shielding magnetic field for canceling a leakage field formed by the pair of third main coils 5 (5a,5b). In this embodiment, the pair of the third main coils 5 (5a,5b) are disposed inside the second support 9b, and the pair of the third shield coils 6 (6a,6b) are disposed inside the third support 9c. In this embodiment, as shown in FIG. 6, the pair of the third main coils 5 (5a,5b) and the pair of the third shield coils 6 (6a,6b) are disposed with the linear region 99 substantially being the center.

In this embodiment, as with the first main coil 1, the position of a pair of continuous current pathways included in the pair of the third main coils 5 (5a,5b) is determined on the basis of contours of the stream function determined so as to decrease the value of a polynomial evaluation function containing a term of the simple sum of sizes of current density distribution in the coil plane of the pair. The stream function can be determined by calculation, treating the pair of the third main coils 5 (5a,5b) and the pair of the third shield coils 6 (6a,6b) as an integrated single structure. For the pair of the third main coils 5 (5a, 5b), the stream function for determining the position of the continuous current pathway can be determined taking into consideration the pair of the third shield coils 6 (6a,6b).

The pair of the third main coils 5 (5a,5b) constitute a pair of continuous current pathways for generating a gradient magnetic field in direction Z along the axis. The coil 5a and the coil 5b are disposed substantially symmetrically with respect to the linear region 99, which is a substantial center, in the Z-axis direction. The direction of current that flows through the coil 5a disposed on one side of the linear region 99, which is a substantial center, is opposite to the direction of current that flows through the coil 5b disposed on the other side.

Figure 7:
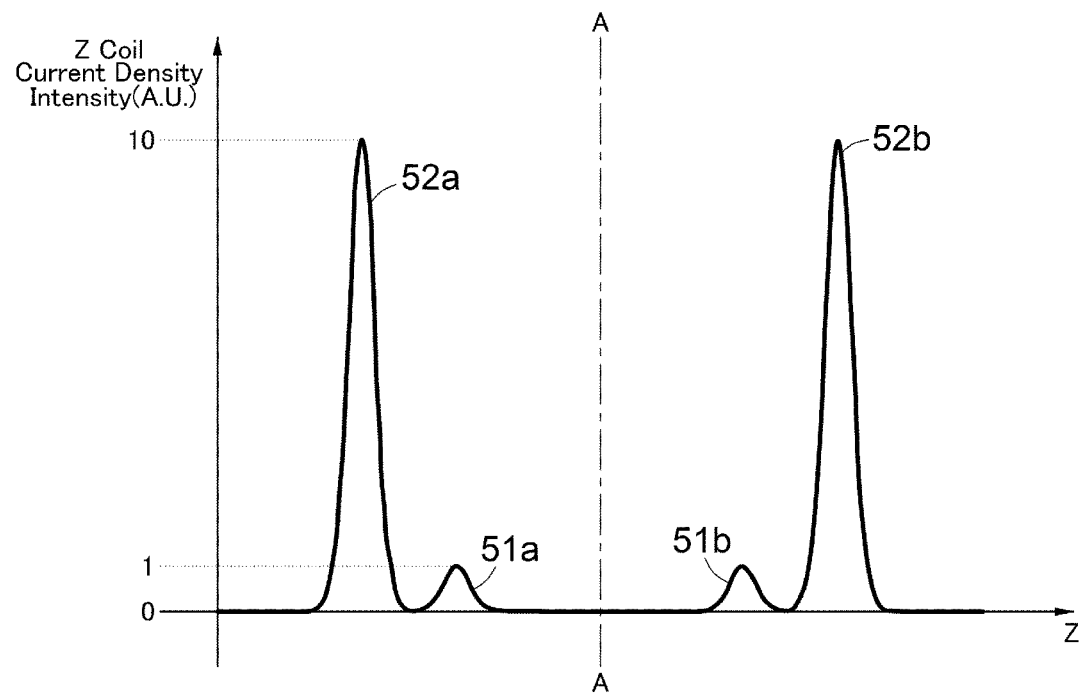
FIG. 7 shows a diagram for explaining the current density distribution of the third gradient coil included in the gradient coil according to an embodiment of the present invention.

FIG. 7 is a diagram for explaining the current density distribution of the third gradient coil included in the gradient coil according to an embodiment of the present invention. In FIG. 7, the horizontal axis of the graph indicates the position in the Z-axis direction, and the vertical axis of the graph indicates the intensity of current density. The line A-A is the center line of the linear region 99 along the transverse section (direction X and direction Y) and corresponds to the line A-A in FIG. 8 and FIG. 9.

In this embodiment, a pair of continuous current pathways that generate a gradient magnetic field in direction Z are disposed such that the current density distribution along direction Z in the axis direction is bimodal at least in either one side or the other side of the center of the linear region. Preferably, the intensity of current density of the peak located far from the center of the linear region is 10 to 15 times the intensity of current density of the peak located closer to the center of the linear region in the bimodal current density distribution.

The schematic graph of FIG. 7 shows four intensity peaks 51a,52a,51b,52b of current density. Two peaks 51a,52a are present on the left side, and two peaks 51b,52b are present on the right side of the line A-A, which indicates the center of the linear region 99. On the left side of the graph, the peak 52a preferably has an intensity 10 to 15 times the intensity of the peak 51a. On the right side of the graph, the peak 52b preferably has an intensity 10 to 15 times the intensity of the peak 51b.

FIG. 8 is a cross-sectional view of the gradient coil according to an embodiment of the present invention taken by the Z-Y plane. FIG. 9 is a partial magnified view of the cross-sectional view shown in FIG. 8, and is a diagram for explaining the layered structure of the first to the third gradient coils disposed inside three supports.

Figure 10:
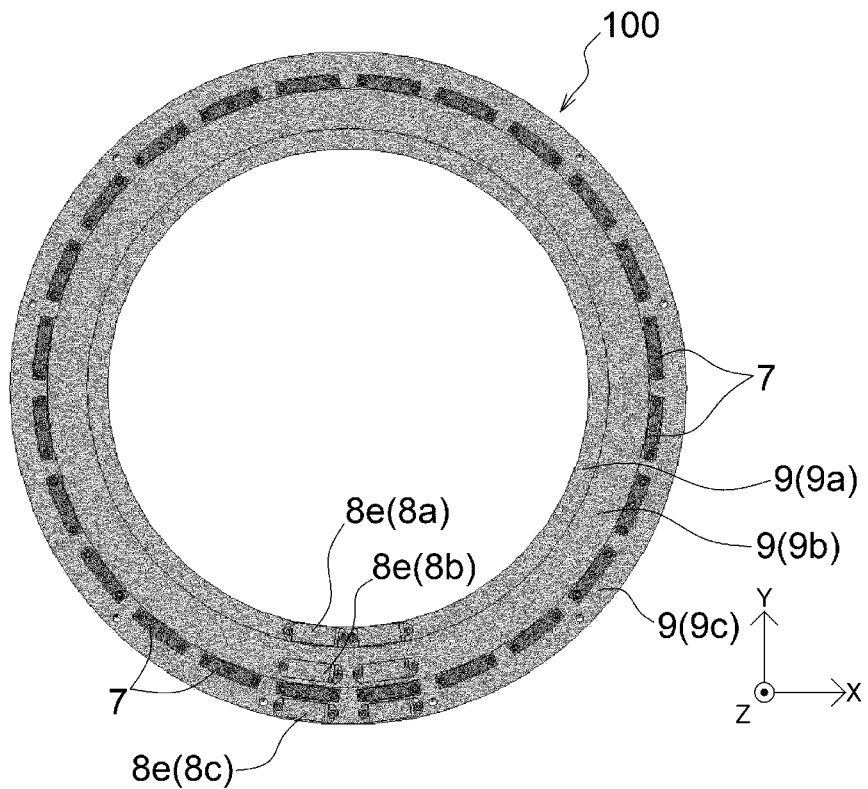
FIG. 10 shows lateral views of the gradient coil according to an embodiment of the present invention as viewed in the Z-axis direction.
Figure 10:
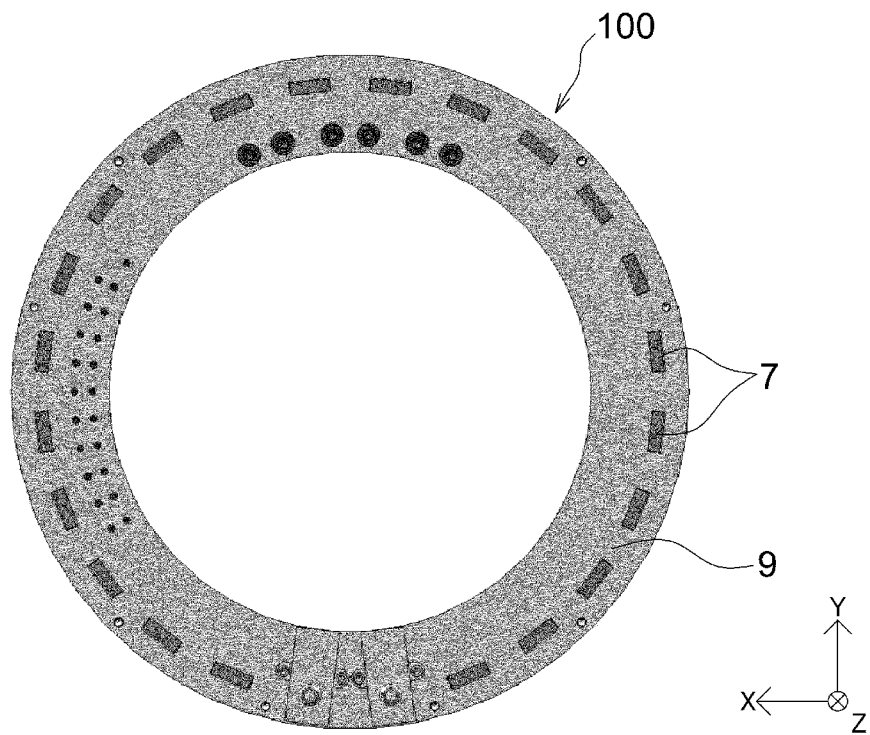

Of the both ends of the gradient coil 100 in the axis direction shown in FIGS. 8 to 10, the end closer to the linear region 99 in the Z-axis direction is referred to as the "proximal end," and the end far from the linear region 99 in the Z-axis direction is referred to as the "distal end." In the embodiment shown in the figures, the end on the positive direction side of the Z axis is the proximal end of the gradient coil 100, and the end in the negative direction side of the Z axis is the distal end of the gradient coil 100. The line A-A is the center line in the Y-axis direction of the linear region 99. The line B-B is the center line in the Y-axis direction of the plate-shaped main coils 1a,1b,3a,3b that constitute the first main coil 1 and the second main coil 3.

In this embodiment, the plurality of plate-shaped main coils 1a,1b that constitute the first main coil 1 are disposed inside the first support 9a, and the plurality of plate-shaped shield coils 2a,2b that constitute the first shield coil 2 are disposed inside the third support 9c. As with the first main coil 1 and the first shield coil 2, the plurality of plate-shaped main coils 3a,3b that constitute the second main coil 3 are disposed inside the first support 9a, and the plurality of plate-shaped shield coils 4a,4b that constitute the second shield coil 4 are disposed inside the third support 9c. The pair of the third main coils 5 are disposed inside the second support 9b, and the pair of the third shield coils 6 are disposed inside the third support 9c.

In this embodiment, the center of the linear region 99 indicated by the line A-A is positioned offset in the Z-axis direction from the center of the first main coil 1 and the second main coil 3, indicated by the line B-B, to the proximal end in the Z-axis direction. In the same manner, the center of the linear region 99, indicated by the line A-A, is positioned offset in the Z-axis direction from the center of the first shield coil 2 and the second shield coil 4, indicated by the line B-B, to the proximal end in the Z-axis direction. The center of the third main coil 5 and the third shield coil 6 in the Z-axis direction is positioned with the linear region 99 substantially being the center.

The linear region 99 is a region in which the intensity of the magnetic field generated by the gradient coil 100 linearly changes. When the gradient coil 100 is incorporated in an MRI system and used for image capturing, the linear region 99 corresponds to the region of interest of a living subject that is the target of image capturing. When the gradient coil 100 is incorporated into an MRI system and used in capturing the image of, for example, the head of a human, the human is inserted from the proximal end of the gradient coil 100 into the void of the gradient coil 100 such that the head is positioned in the linear region 99.

In this embodiment, as shown in the perspective view of FIG. 1, cutouts that conform to the shape of the shoulders of the human body are not provided to the gradient coil 100. Providing cutouts as shown in PTL 1 to a gradient coil increases the dimension of the gradient coil in the Z-axis direction. However, the gradient coil 100 according to this embodiment is designed so as to be compact in the dimension in the Z-axis direction without having such cutouts. As designed to be compact, the gradient coil 100 according to this embodiment is suitable for positioning a local part, such as the head of a living subject, in a limited space for image capturing.

FIG. 10 shows lateral views of the gradient coil according to an embodiment of the present invention observed from the Z-axis direction. FIG. 10(A) is a lateral view from the front of the arrow in the Z-axis direction (on the proximal end side), and FIG. 10(B) is a lateral view from the back of the arrow in the Z-axis direction (on the distal end side).

The gradient coil 100 may include a plurality of through-holes 7 for accommodating a yoke that corrects the non-uniformity of the magnetostatic field and a plurality of cooling tubes 8 for allowing a refrigerant such as cool water to flow. In this embodiment, 24 through-holes 7 are provided circumferentially to the third support 9c at substantially equal intervals, and three cooling tubes 8 (8a, 8b, 8c) are provided to the support 9. The first cooling tube 8a is disposed inside the first support 9a, the second cooling tube 8b is disposed inside the second support 9b, and the third cooling tube 8c is disposed inside the third support 9c. Preferably, these three cooling tubes 8 each have a refrigerant introduced such that the refrigerants flow in alternating directions. The elements indicated by reference numeral 8e in FIG. 10 are tools for connecting the cooling tubes 8 to the outside of the gradient coil 100.

In another embodiment, the gradient coil 100 may have a set of correction coils disposed inside the second support 9b, the correction coils being for correcting the non-uniformity of a magnetic field or the fluctuation of a magnetic field, and may have a shield coil disposed inside the third support 9c, the shield coil being for generating a shielding magnetic field for cancelling a leakage field formed by the set of correction coils. The set of correction coils may be of, for example, a $B_0$ correction coil, a $Z^2$ correction coil, a ZX correction coil, a ZY correction coil, a $X^2$-$Y^2$ correction coil, or a XY correction coil. The $B_0$ correction coil corrects the fluctuation of a magnetostatic field $B_0$ for defining the quantization axis in an MRI system. The $Z^2$ correction coil corrects a magnetic field component that changes by the square of the distance in the Z-axis direction. The ZX correction coil corrects a magnetic field component that changes by the product of the distance in the Z-axis direction and the distance in the X-axis direction. The ZY correction coil corrects a magnetic field component that changes by the product of the distance in the Z-axis direction and the distance in the Y-axis direction. The $X^2$-$Y^2$ correction coil corrects a magnetic field component that changes by the difference between the square of the distance in the X-axis direction and the square of the distance in the Y-axis direction. The XY correction coil corrects a magnetic field component that changes by the product of the distance in the X-axis direction and the distance in the Y-axis direction.

Table 1 shows an example of the dimensions of the gradient coil 100 according to this embodiment. In FIGS. 8 and 9 and Table 1, reference numeral $R_L$ denotes the length of the linear region 99 formed in a substantially oblate spheroid shape in a three-dimensional space in the long axis direction, and reference numeral $R_S$ denotes the length of the linear region 99 in the short axis direction. Reference numeral $\phi_1$ denotes the inner diameter of the first support 9a. Reference numeral $\phi_2$ denotes the inner diameter of the second support 9b. Reference numeral $\phi_3$ denotes the inner diameter of the third support 9c. Reference numeral $\phi_4$ denotes the outer diameter of the third support 9c. Reference numeral $L_1$ denotes the dimension from the center of the linear region 99 to the proximal end of the first support 9a. Reference numeral $L_2$ denotes the dimension from the center of the linear region 99 to the proximal end of the second support 9b. Reference numeral $L_3$ denotes the dimension from the center of the linear region 99 to the proximal end of the third support 9c. Reference numeral $L_4$ denotes the dimension from the center of the linear region 99 to the distal end of the third support 9c. Reference numeral $L_5$ denotes the dimensions of the first main coil 1 (plate-shaped main coils 1a,1b) and the second main coil 3 (plate-shaped main coils 3a,3b) in the Z-axis direction. Reference numeral $L_6$ denotes the dimension of the third main coil 5 in the Z-axis direction. Reference numeral $L_7$ denotes the dimension of the third shield coil 6 in the Z-axis direction. Reference numeral $L_{off}$ denotes the distance between the line A-A and the line B-B in the Z-axis direction, and the distance of offset between the center of the plate-shaped main coils 1a,1b,3a,3b that constitute the first main coil 1 and the second main coil 3 and the center of the linear region 99 in the Z-axis direction.

TABLE 1

| Reference Numeral | Dimension (cm) |
| --- | --- |
| $R_L$ | 25 |
| $R_S$ | 21 |
| $\phi_1$ | 42 |
| $\phi_2$ | 45.5 |
| $\phi_3$ | 52.52 |
| $\phi_4$ | 59 |
| $L_1$ | 14.5 |
| $L_2$ | 20 |
| $L_3$ | 28 |
| $L_4$ | 64 |
| $L_5$ | 73.5 |
| $L_6$ | 38 |
| $L_7$ | 56 |
| $L_{off}$ | 17.5 |

Design of Gradient Coil

In the present invention, a gradient coil is designed on the basis of the target field method. In the target field method, a magnetic field distribution that a coil intends to generate is given as a target, and the distribution of current density in the coil planes is determined by performing calculation backward from the desired magnetic field distribution given as a target. In the present invention, the boundary element method is applied in dividing a region in a coil plane in the target field method. This gives a magnetic field distribution that a coil will generate. The winding pattern of a coil is determined from the distribution of the calculated current density. In the target field method, the distribution of current density is expressed by using a stream function.

Determination of Stream Function

In an embodiment of the present invention, a magnetic field linearity is set as a target performance value, and an optimum stream function is determined within the range of the set performance value. In this embodiment, the magnetic field linearity set as a target performance value is set as the maximum value of acceptable non-linearity of a magnetic field. The stream function is determined so as to decrease the value of a polynomial evaluation function containing a term of the simple sum of sizes of current density distribution in a coil plane. Preferably, the stream function is determined so as to minimize the value of a polynomial evaluation function containing a term of the simple sum of sizes of current density distribution in a coil plane.

In this embodiment, the boundary element method is applied in dividing a region of a coil plane in the target field method. As explained in NPL 2, the boundary element method divides a region in a coil plane into a plurality of polygonal patch regions (typically triangles; triangles in this embodiment as well) to express the current density distribution in the coil plane. Because of the boundary element method applied, a plurality of nodes surrounded by a plurality of patch regions in their circumference are expressed in a region in the coil plane. For each of the plurality of patch regions that surround the nodes, a current element that flows in a clockwise or counterclockwise direction with the node as the center is expressed.

Figure 11:
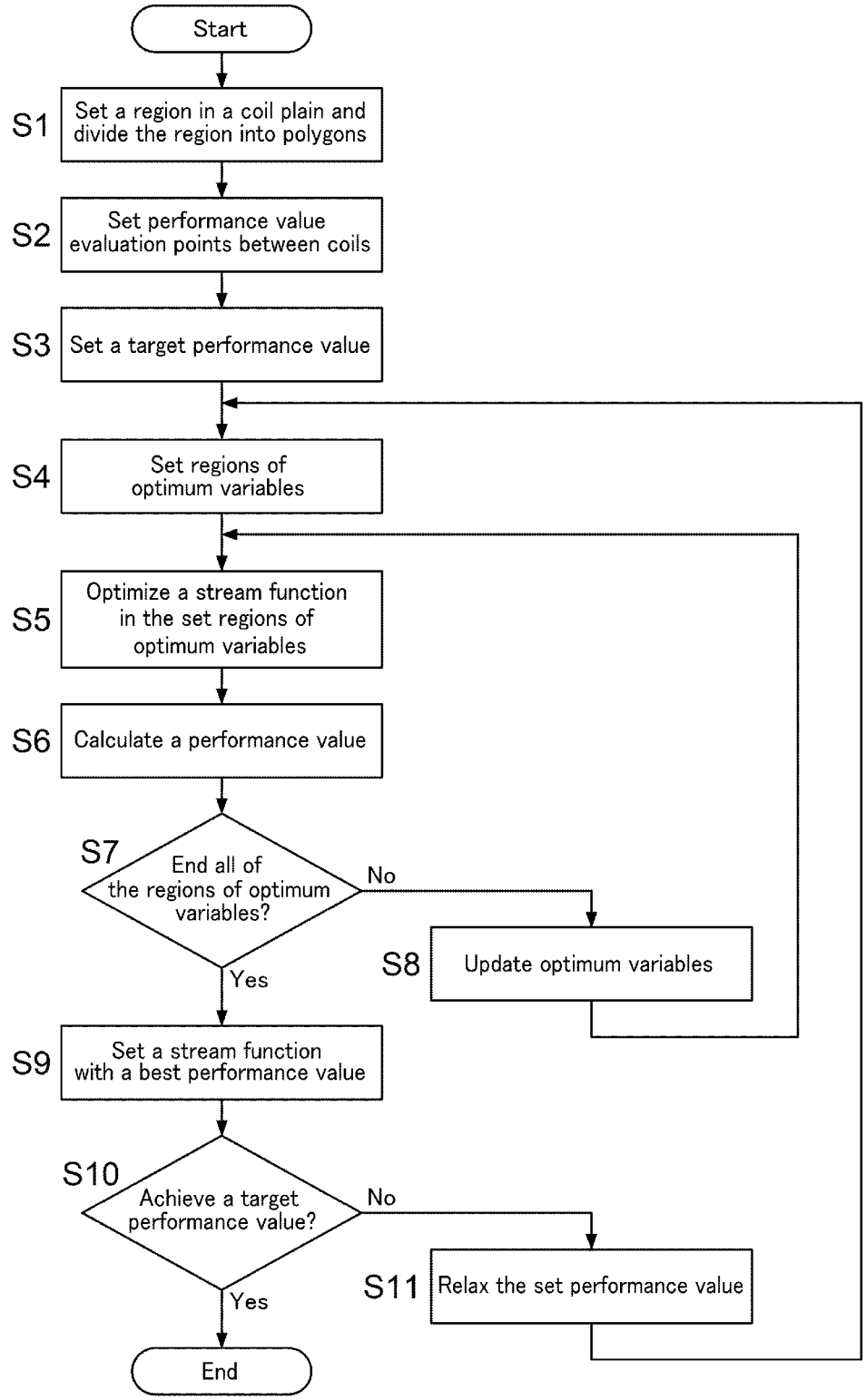
FIG. 11 shows a flowchart for explaining the determination procedure for the stream function in a method for designing a gradient coil according to an embodiment of the present invention.
Figure 12:
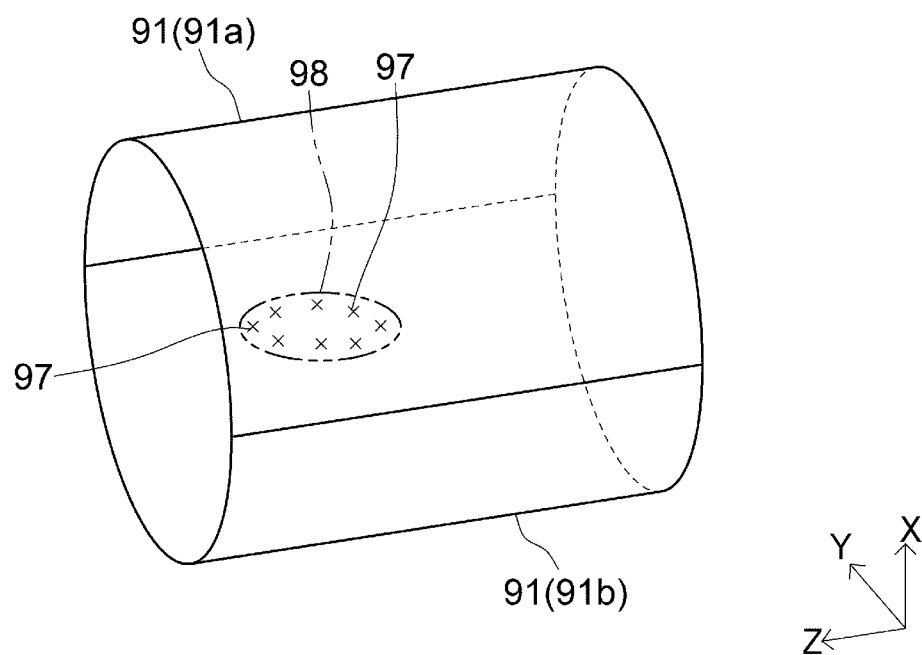
FIG. 12 shows a diagram for explaining a virtual region in a coil plane set for determining a stream function.

FIG. 11 is a flowchart for explaining the determination procedure for a stream function in the method for designing a gradient coil according to an embodiment of the present invention. FIG. 12 is a diagram for explaining a virtual region in a coil plane that is set in determining a stream function. Typically, the determination procedure for a stream function described below is enabled as a numerical simulation by a computer equipped with a processor and a memory in its hardware configuration.

In the determination procedure for a stream function described below, the first gradient coil that functions as a cross-sectionally gradient coil is described as a virtual coil plane. The determination procedure for a stream function described below can be applied not only to the first gradient coil but also to the second gradient coil that functions as a cross-sectionally gradient coil, and also to the third gradient coil that functions as an axially gradient coil. When a stream function in the third gradient coil plane is determined as a virtual region in the third gradient coil plane, a pair of the third main coils 5 (5a,5b) shown in, for example, FIG. 6 can be determined to be a virtual region in the coil plane.

In step S1, a region in a coil plane is set, and the set region is divided into a plurality of polygonal (triangle) patch regions. In this embodiment, as shown in FIG. 12, regions in the coil plane are set as coil planes of two curved plate-shaped coils 91a,91b disposed so as to face each other by using 3D coordinates. The above-mentioned boundary element method is applied in dividing the region in the planes of coils 91a,91b. Because of the boundary element method applied, a plurality of nodes surrounded by a plurality of patch regions in their circumference are set in the region in the planes of coils 91a,91b, and the current density distribution in the planes of coils 91a,91b is expressed. This gives a magnetic field distribution between two coils disposed so as to face each other.

In step S2, performance value evaluation points are set in a region between coils. In this embodiment, as shown in FIG. 12, a plurality of performance value evaluation points 97 are set in a space sandwiched by the two planes of coils 91a,91b disposed so as to face each other by using 3D coordinates. The spatial region in which the performance value evaluation points 97 are set in this embodiment is indicated by reference numeral 98 in FIG. 12. The plurality of performance value evaluation points 97 (e.g., 2280 points) are set in a region on the surface that covers the spatial region 98, for example, at equal intervals. The plurality of performance value evaluation points 97 may be set across the entire spatial region 98. In this embodiment, the spatial region 98 of the performance value evaluation points 97 is disposed asymmetrically, offset from the center of the planes of coils 91a,91b in the Z-axis direction.

In step S3, a target performance value is set. In this embodiment, the maximum value of acceptable non-linearity of a magnetic field (unit: percent) is set as a target performance value. In this embodiment, for each of the plurality of performance value evaluation points 97 set in a space by using 3D coordinates, a target performance value is set. This sets the linearity of a magnetic field as a target performance value for the region 98 of the performance value evaluation points 97 disposed offset from the center of the planes of coils 91a,91b in the Z-axis direction.

In step S4, the region of optimization variables ($\alpha$, $\beta$, p, q, r) is set. In this embodiment, the range of values for optimization variables is the following: $0<\alpha<1$, $0<\beta<1$, $p=(2,\infty)$, $q=(1,2)$, and $r=(1,2)$. Value 1 that indicates a simple sum is selected by using optimization variable q or r.

In step S5, the stream function is optimized within the range of the set optimization variables ($\alpha$, $\beta$, p, q, r). The stream function $$\varphi(\vec{r})$$

results in $$\varphi(\vec{r}) = \sum_{n}^{N} I_n \varphi_n(\vec{r})$$

by using the values at vertices of triangles and a basis function. $I_n$ is a value of a stream function at the vertices of the triangle patch regions.

$$\varphi_n$$

is a basis function, and has a value of 1 only around the vertices of triangle patch regions. N is the number of vertices. This stream function is determined so as to minimize the value of an evaluation function in the following polynomial evaluation function containing a term of the simple sum of sizes of current density distribution in the coil planes.

$$\alpha \frac{\rho}{t} \sum_i^{Ne} \|\vec{J}_i\|_p A_i \|\vec{J}_i\|_q + \beta(1-\alpha) \sum_i^{Ne} A_i \|\vec{J}_i\|_r$$

In this evaluation function, the first term corresponds to the heat generation of a coil, and the second term corresponds to the full length of the coil (continuous current pathway). Here, the following equation holds.

$$\vec{j}_i = J_i \vec{\varphi}_i$$

ρ denotes an electric charge density. t denotes the thickness of a conductor that constitutes the coil plane. Ne is a total number of triangle patch regions in the boundary element method. Ai denotes the area of the i-th triangle patch region in the boundary element method, and vector $j_i$ denotes the current density distribution vector of the i-th triangle patch region. $J_i$ denotes a matrix composed of three vectors that connect the vertices of the i-th triangle patch region. The vector $$\vec{\varphi}_i$$

denotes a stream function vector composed of three stream function values $I_n$ of the vertices of the i-th triangle patch region (i.e., three $I_n$ values).

In step S6, a performance value is calculated. The performance value calculated is a value in each of the performance value evaluation points set in step S2.

In this embodiment, the non-linearity of a magnetic field set in step S3 is calculated as a performance value. First, a scalar quantity calculated from the vector obtained by applying a rotation (vector operator) to the product of the basis function for the stream function and the unit vector perpendicular to the surface on which a current density exists is determined for the performance value evaluation points. Second, the product of the determined scalar quantity and the value at a vertex of a triangle patch region for which the scalar quantity has been computed by the stream function determined in step S5 is determined for all of the vertices of triangle patch regions. Finally, the sum of the products determined for all of the vertices of triangle patch regions is determined, and the magnetic field intensity at the performance value evaluation points is determined. From the determined magnetic field intensity, the non-linearity of the magnetic field at the performance value evaluation points is calculated as the performance value for the determined stream function.

In step S7, whether the processes of step S5 and step S6 have been performed for all of the regions of the optimization variables is determined. If the result indicates that the processes are not performed (No in step S7), the optimization variables (α, β, p, q, r) are updated in step S8, and the process in step S5 is performed again using the updated optimization variables. The increment range for updating the optimization variables α and β can be a value in the range of, for example, 0.1 to 0.01. For example, in the first stage of updating, the optimization variables α,β are updated with a coarse increment of 0.1. Updating the variables is repeated, and at the final stage of updating at which the optimization variables are approaching their optimum value, the optimization variables α,β are updated at a fine increment of 0.01.

If the result of the determination in step S7 indicates that the processes are performed (Yes in step S7), a stream function with the optimum performance value is determined in step S9. The stream function is determined for each combination of optimization variables α, β, p, q, and r used in optimization, and the stream function is determined multiple times by performing the process of step S5 multiple times. In this embodiment, of these multiple stream functions, the stream function with the best performance value calculated in step S6 is determined as a stream function with the best performance value.

In step S10, whether the determined stream function has achieved the target performance value is determined. If the result indicates that the determined stream function has not achieved the target performance value (No in step S10), the determined performance value is relaxed in step S11, and the process in step S4 is performed again using the relaxed performance value.

If the result in step S10 indicates that the determined stream function has achieved the target performance value (Yes in step S10), the series of steps is ended.

Determination of Winding Pattern

In the present invention, the winding pattern of a coil that represents a current density is determined on the basis of the contour of every predetermined step of the stream function. The winding pattern of a coil is determined as a continuous seamless current pathway disposed in the coil plane. The seamless current pathway can be provided by forming a notch or a cutout with a predetermined width in a plate-shaped conductive member. Alternatively, the seamless current pathway can be provided by using a strand conductor.

Figure 13:
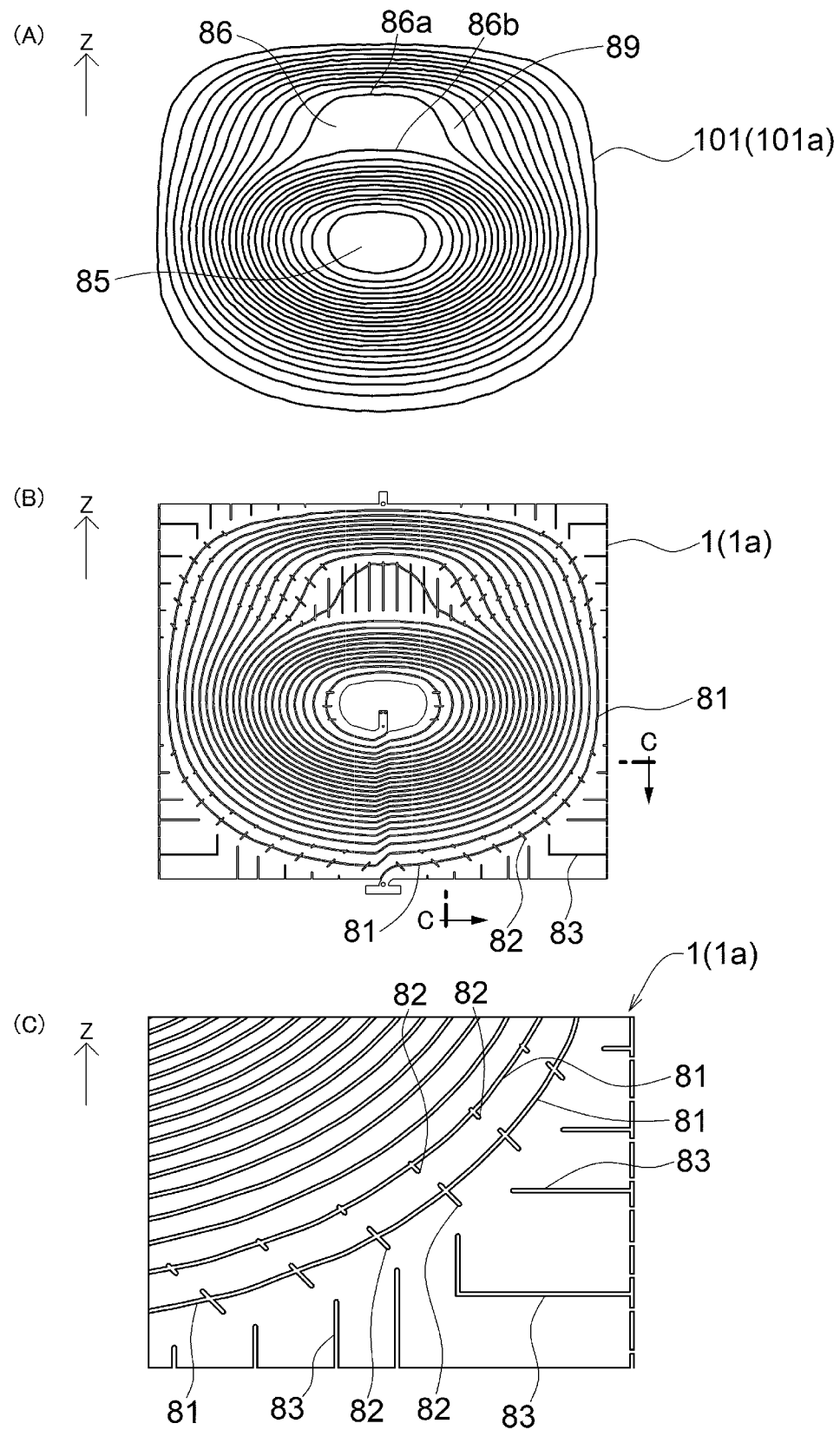
FIG. 13 shows diagrams for explaining the winding patterns of the first gradient coil and the second gradient coil included in the gradient coil according to an embodiment of the present invention.

FIG. 13 shows diagrams for explaining the winding pattern of the first gradient coil and the second gradient coil included in the gradient coil according to an embodiment of the present invention.

A contour pattern 101 (101a) shown in FIG. 13(A) is a contour pattern of every predetermined step of the stream function determined for the plate-shaped main coil 1a shown in FIGS. 2 and 3.

In this embodiment, the plate-shaped main coil 1a is an asymmetric coil, and the contour pattern 101a of the plate-shaped main coil 1a has a region 89 protruding in the Z-axis direction. The region 89 corresponds to the linear region 99 in the gradient coil 100. In the region 89 of the contour pattern 101a, the contour protrusion spacing becomes wider as it approaches the linear region 99, and becomes closer as it becomes distant from the linear region 99.

The through-groove pattern of the plate-shaped main coil 1a shown in FIG. 13 (B) is a pattern of the through-groove provided in the coil plane on the basis of the contour pattern 101a shown in FIG. 13(A). FIG. 13(C) is a partially magnified view of the pattern of the through-groove shown in FIG. 13(B).

In this embodiment, the pattern of the through-groove provided in the coil plane includes a first through-groove 81, a second through-groove 82, and a third through-groove 83. The first through-groove 81, the second through-groove 82, and the third through-groove 83 are provided by forming a notch or a cutout with a predetermined width in a plate-shaped conductive member. For example, a conductive member for use is a copper plate with a thickness of about 2 to 3 mm.

The first through-groove 81 is a continuous through-groove and defines the region of a continuous current pathway corresponding to the winding pattern of the coil. The first through-groove 81 is disposed between contours of the stream function in the coil plane. The region present in between the first through-groove 81 in the coil plane corresponds to the continuous current pathway.

Figure 14:
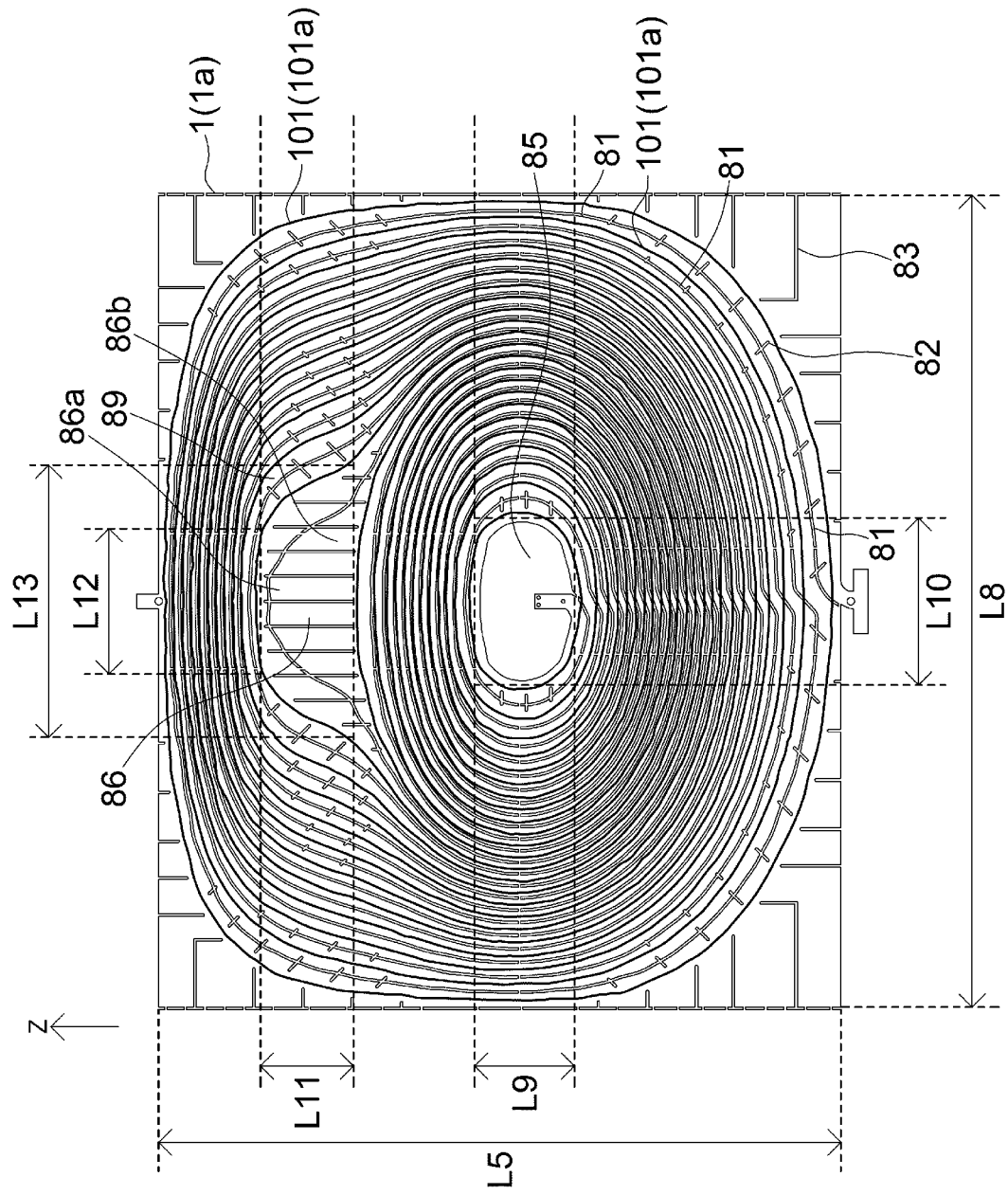
FIG. 14 is a diagram of the contour pattern shown in FIG. 13 superimposed on the pattern of a through-groove.
Figure 15:
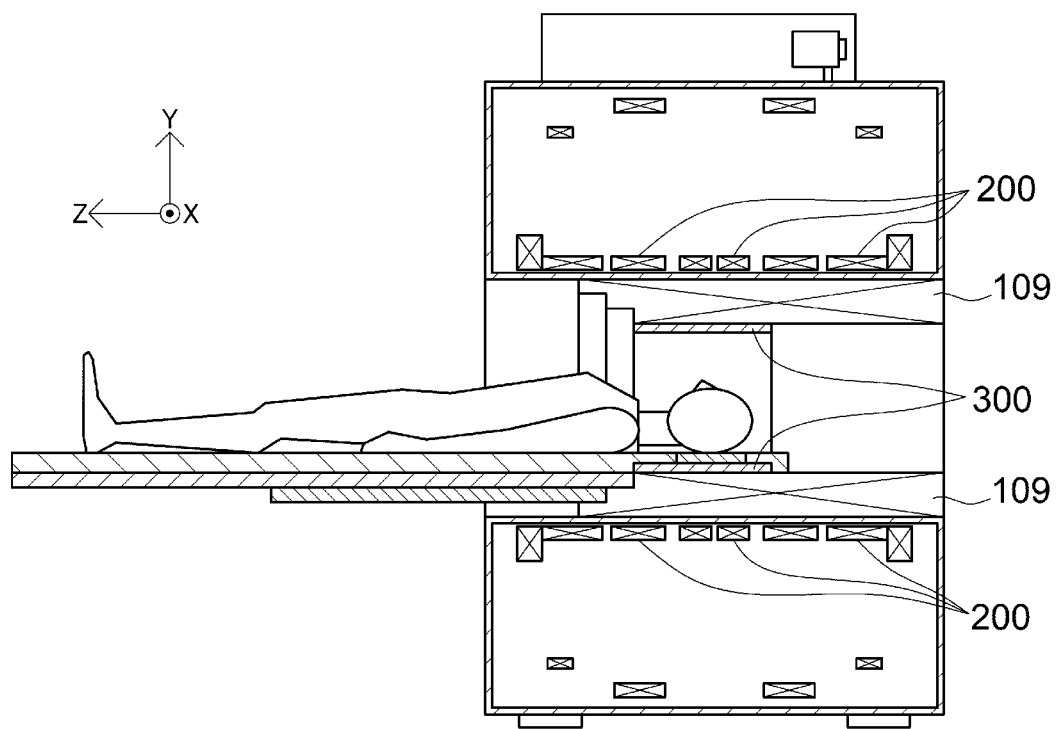
FIG. 15 shows a partial cross-sectional view of an illustrative structure of an MRI system for head imaging.

FIG. 14 is a diagram showing the contour pattern shown in FIG. 13 superimposed on the patterns of the through-grooves. As shown in FIG. 14, the first through-groove 81 is disposed so as to sandwich the contour pattern 101 in between the first through-groove 81.

The second through-groove 82 is disposed so as to intersect with the continuous first through-groove 81. The third through-groove 83 is disposed so as to extend from an end of the coil to the continuous first through-groove 81 or the second through-groove 82. The second through-groove 82 and the third through-groove 83 provided at a plurality of points in the coil plane allows the width of the continuous current pathway to be adjusted. This divides the coil plane into a plurality of small regions, and reduces the generation of eddy current in the coil plane. Reducing eddy current improves magnetic field uniformity and gradient magnetic field efficiency.

As in the plate-shaped main coil 1a shown in FIG. 13 and FIG. 14 as an example, the patterns of the through-grooves of the other plate-shaped main coils 1b,3a,3b are also disposed in the coil planes on the basis of the contour pattern of the determined stream function.

In this embodiment, the continuous current pathway in the plane of the plate-shaped main coils 1a,1b,3a,3b defines a substantially rectangular region 85 in which a continuous current pathway is not present, and a substantially trapezoidal region 86 in which a continuous current pathway is not present. The substantially rectangular region 85 is disposed in the center of the coil plane, and the substantially trapezoidal region 86 is disposed together with the substantially rectangular region 85 in the coil plane along the Z axis. The substantially rectangular region 85 is located, among a short side 86a and a long side 86b of the substantially trapezoidal region 86, on the side of the long side 86b. The substantially rectangular region 85 is linearly symmetric with respect to the Z axis, and the substantially trapezoidal region 86 is also linearly symmetric with respect to the Z axis.

In the plate-shaped main coil 1a shown as an example in FIGS. 13 and 14, the dimension in the Z-axis direction of the entire outline of the current pathway surrounded by the continuous current pathway is $L_5$, and the dimension in the direction perpendicular to the Z-axis direction is $L_8$. Preferably, dimension $L_9$ of the substantially rectangular region 85 in the Z-axis direction is within the range of 10% to 15% of dimension $L_5$ of the outline surrounded by the continuous current pathway, and dimension $L_{10}$ in the direction perpendicular to the Z axis is within the range of 16% to 22% of dimension $L_8$ of the outline surrounded by the continuous current pathway. Preferably, dimension $L_{11}$ of the substantially trapezoidal region 86 in the Z-axis direction is within the range of 10% to 15% of dimension $L_5$ of the outline surrounded by the continuous current pathway, dimension $L_{12}$ of short side 86a in the direction perpendicular to the Z axis is within the range of 18% to 24% of dimension $L_8$ of the outline surrounded by the continuous current pathway, and dimension $L_{13}$ of long side 86b in the direction perpendicular to the Z axis is within the range of 31% to 37% of dimension $L_8$ of the outline surrounded by the continuous current pathway.

As in the plate-shaped main coil 1a of the first main coil 1, the pattern of the through-groove, or a strand conductor, described later, can be provided to the pair of the third main coils 5 (5a,5b) on the basis of the contour pattern of the determined stream function.

Effect

The method for designing a gradient coil according to the present invention determines a stream function on the basis of the target field method so as to decrease the value of a polynomial evaluation function containing a term of the simple sum of sizes of current density distribution in the coil plane. Traditionally, in order to achieve setting performance with fewer current values, a term of the sum of squares of sizes of the current density distribution in the coil plane has been added to an evaluation function on the basis of the target field method, and a stream function has been determined so as to minimize the value of this evaluation function. In the present invention, a stream function is determined so as to decrease the value of a polynomial evaluation function containing a term of the simple sum of sizes of current density distribution. This allows the coil to have improved performance while maintaining the dimensions of the coil at current levels, thus improving the resolution of an image captured by an MRI system.

Coil dimensions and coil performance are in a trade-off relationship. The method for designing a gradient coil according to the present invention can make the dimensions of a coil smaller while maintaining the uniformity or linearity of the magnetic field generated by the coil and the rollover value at current levels.

Because of the trade-off relationship, reducing the size of a gradient coil generally decreases the uniformity of the gradient magnetic field generated by the coil in an image-captured region and causes artifacts in an image captured with an MRI system, reducing the resolution of the captured image. However, the method for designing a gradient coil according to the present invention allows a coil to have smaller dimensions while maintaining the uniformity of the magnetic field generated by the coil and the rollover value in an image-captured region at current levels, thus reducing artifacts generated in the captured image.

A gradient coil reduced in size can reduce the inductance of the coil and achieve a higher slew rate of the gradient magnetic field. This increases or decreases the current to be flown in the coil in a short time and thus switches the gradient magnetic field to be applied with less current, quickly in a short time, thereby allowing an image to be captured in a higher duty cycle. For example, diffusion tensor mapping, which is a technique for exploring the connections between neural functions in the brain, applies a gradient magnetic field at a higher duty cycle, and this can suppress signal reduction and improve the resolution of the captured image in diffusion tensor mapping.

OTHER EMBODIMENTS

The present invention has been described above with specific embodiments. However, the present invention is not limited to the embodiments above.

The method applied in dividing a region in the coil plane in the target field method is not used in the boundary element method described above. Various methods for dividing a region known in the target field method can be applied in dividing a region in a coil plane.

In the series of steps of designing a gradient coil, the target performance value is not limited to the non-linearity of a magnetic field. For example, the percentage (unit: %) of residual eddy current may be set as a target performance value in the procedure of step S3, or the non-linearity and the percentage of residual eddy current in a magnetic field may both be set as target performance values in the procedure of step S3. If the percentage of residual eddy current is set as a target performance value, the performance value evaluation points 97 are also set for the outside of the planes of the two coils 91a,91b disposed so as to face each other. In this case, the spatial region 98, in which the performance value evaluation points 97 are set, includes the planes of the two coils 91a and 91b disposed so as to face each other.

The method for calculating the non-linearity of a magnetic field at the performance value evaluation points as a target performance value is not limited to the method described above. The non-linearity of a magnetic field can also be calculated using, for example, the Biot-Savart law. First, the winding pattern of a coil that represents the current density is determined on the basis of the contour of every predetermined step of the stream function determined in step S5. Second, magnetic field calculation is performed by applying the Biot-Savart law to the determined winding pattern. Finally, from the magnetic field intensity calculated based on the Biot-Savart law, the non-linearity of the magnetic field at performance value evaluation points is calculated as a performance value of the winding pattern of the coil on the basis of the determined stream function.

The shape of the linear region 99 is not limited to an oblate spheroid. The shape of the linear region 99 may be a prolate spheroid or a sphere.

In the gradient coil 100, the position at which the plurality of through-holes 7 are disposed is not limited to the third support 9c. The position at which the plurality of through-holes 7 is disposed may be on at least any of the following: the first support 9a to the third support 9c.

In the gradient coil 100, the position at which a set of correction coils is disposed is not limited to the second support 9b. The set of correction coils may be disposed on any of the following: the first support 9a to the third support 9c. For example, all sets of correction coils may be disposed in the second support 9b or the third support 9c. The set of correction coils disposed within the second support 9b and the set of correction coils disposed within the third support 9c can be of any combination as long as the $B_0$ correction coil is disposed inside the shield coil of the $B_0$ correction coil.

The method for defining the continuous current pathway corresponding to the winding pattern of a coil is not limited to the method for forming a notch or a cutout with a predetermined width in a plate-shaped conductive member.

The winding pattern of a coil can be determined on the basis of the contour of every predetermined step of the stream function, and the winding pattern of a coil may be defined by disposing a strand conductor that functions as a continuous current pathway along the contours of the stream function. For example, the strand conductor for use may be of various conductive metal wires such as copper wire. The coil can be formed, for example, by impregnating a strand conductor disposed along the contours of a stream function with an epoxy resin.

The third gradient coil that generates a gradient magnetic field in direction Z along the axis direction for use may be a Maxwell coil pair, which are a typical coil form known as a gradient coil in the Z-axis direction. For example, a Maxwell coil pair can be used in the pair of the third main coils 5 (5a,5b) and the pair of the third shield coil 6 (6a,6b).

EXAMPLES

A gradient coil was designed by numerical calculation using a computer on the basis of the designing method described in the embodiment above. The coil was designed with both the non-linearity of a magnetic field and the percentage of residual eddy current as target performance values. The arrangement and dimensions of the coils in the designed gradient coil were as shown in FIGS. 1 to 10 and Table 1. A gradient coil was produced based on the numerically designed winding pattern and evaluated for its performance. Table 2 shows the results of the performance evaluation. In Table 2, DSV is an abbreviation for diameter spherical volume, which corresponds to the size of the region of interest.

As a Comparative Example, Table 2 shows the results of a disclosed performance evaluation of a 3T MRI system manufactured by General Electric Company of the United States. The dimensions of the inner and outer diameters of the gradient coil of the Example are equivalent to those of the gradient coil of the Comparison Example. With reference to Table 2 below, the performance of the coils of the Example and the Comparative Example was examined.

TABLE 2

| Axis | Comparative Example | | | Example | | |
|---|---|---|---|---|---|---|
| | X | Y | Z | X | Y | Z |
| Inner Diameter/Outer Diameter (mm) | 420/590 | | | 420/590 | | |
| Gradient Magnet Field Efficiency (μT/m/A) | 129 | 129 | 133 | 140 | 140 | 138 |
| Inductance (μh)@DC | 234 | 204 | 204 | 222 | 224 | 165 |
| Resistance Value (mΩ)@DC | 124 | 114 | 87 | 85 | 85 | 83 |
| DSV 220*220*200: Non-linearity of Magnetic Field | | | | −6.64%/+3.0% | −6.33%/+3.29% | −8%/+4% |
| DSV 220*220*200: Non-uniformity of Magnetic Field | | | | +16.5%/−21.5% | +21.3%/−22.12% | +14%/−28% |
| DSV 250*250*210: Non-linearity of Magnetic Field | 17% | 17% | 17% | −7.39%/+3.16% | −6.71%/+6.29% | −8.43%/+4.84% |
| DSV 250*250*210: Non-uniformity of Magnetic Field | | | | +20%/−24% | +33.8%/−46.7% | +19%/−28.68% |
| Residual Eddy Current (%) | 0.2 | 0.2 | 0.2 | +0.09 | +0.08 | −0.2 |
| Rollover Value from the Center of Magnetic Field (mm) | | | | 143 | 143 | 150 |

The non-linearity of the magnetic field was examined. In the Example, the values representing the non-linearity of the magnetic field were lower than those in the Comparative Example, indicating an improved linearity of the magnetic field even with similar dimensions. The residual eddy current was also examined. In the Example, the percentage of the magnetic field generated by residual eddy current was lower than in the Comparative Example. In directions X and Y (transverse section), the generated residual eddy current was about half.

From these results, the gradient coil in the Example was confirmed to have exhibited an improved linearity of the magnetic field and a reduced percentage of the magnetic field generated by residual eddy current as compared with the gradient coil in the Comparative Example.

The gradient magnetic field efficiency, inductance, and resistance values were examined. In the Example, the gradient magnetic field efficiency in directions x and y (transverse section) was 140 µT/m/A, which was improved from the performance value of 129 µT/m/A in the Comparative Example. In the Example, the inductance of the coil in the transverse section was 224 µH, which was improved from the performance value of 234 µH in the Comparative Example. In the Example, the resistance value of the coil in the transverse section was 85 mΩ, which was improved from the performance value of 124 mΩ in the Comparative Example.

From these results, the gradient coil of the Example was confirmed to have an improved performance while maintaining the same dimensions as those of the gradient coil of the Comparative Example. The inductance values and the resistance values used in comparison of the performance of coils were the performance values on the side of the bottleneck of operation among the performance values in directions X and Y (transverse section).

DESCRIPTION OF THE REFERENCE NUMERALS

1 (1a,1b) first main coil (plate-shaped main coil)
2 (2a,2b) first shield coil (plate-shaped shield coil)
3 (3a,3b) second main coil (plate-shaped main coil)
4 (4a,4b) second shield coil (plate-shaped shield coil)
5 (5a,5b) third main coil
6 (6a,6b) third shield coil
7 through-hole
8 (8a,8b,8c) cooling tube
9 (9a,9b,9c) support
81 first through-groove
82 second through-groove
83 third through-groove
85 substantially rectangular region
86 substantially trapezoidal region
91 (91a,91b) virtual coil plane
97 performance value evaluation point
98 spatial region on which performance value evaluation points are set
99 linear region
100 gradient coil
101 contour pattern

The invention claimed is:

1. A method for designing a gradient coil, the method comprising
   determining performance value evaluation points between a plurality of coils disposed so as to face each other, and
   determining a stream function on a basis of the performance value evaluation points and a target field method so as to decrease a value of a polynomial evaluation function containing a term of a simple sum of sizes of current density distribution in coil planes, and
   disposing a continuous current pathway in the coil planes on a basis of contours of the determined stream function.

2. The method for designing a gradient coil according to claim 1, wherein disposing a continuous current pathway in the coil planes comprises disposing a continuous first through-groove that defines a region of the continuous current pathway between the contours in the coil planes.

3. The method for designing a gradient coil according to claim 2, wherein disposing a continuous current pathway in the coil planes further comprises disposing a second through-groove that intersects with the continuous first through-groove in the coil planes, and a third through-groove extending from an end of each coil toward the continuous first through-groove or the second through-groove in the coil planes.

4. The method for designing a gradient coil according to claim 1, wherein disposing a continuous current pathway in the coil planes comprises disposing a strand conductor that functions as the continuous current pathway along the contours in the coil planes.

5. The method for designing a gradient coil according to claim 1, wherein the performance value evaluation points are set between the plurality of coils disposed so as to face each other, the plurality of coils being curved plate-shaped.

6. The method for designing a gradient coil according to claim 5, wherein the performance value evaluation points are each set at a position offset from a center of a cylindrical void defined by the plurality of curved plate-shaped coils along a long axis of the cylindrical void toward an end of the cylindrical void.

7. A gradient coil comprising a plurality of coils disposed so as to face each other, wherein the coils each comprise a continuous current pathway in coil planes, and a position of the continuous current pathway is determined on a basis of contours of a stream function determined on a basis of a target field method so as to decrease a value of a polynomial evaluation function containing a term of a simple sum of sizes of current density distribution in the coil planes.

8. The gradient coil according to claim 7, wherein the coils each comprise a continuous first through-groove that defines a region of the continuous current pathway between the contours in the coil planes.

9. The gradient coil according to claim 8,
   wherein the coils each further comprise
      a second through-groove that intersects with the continuous first through-groove, and
      a third through-groove extending from an end of each coil toward the continuous first through-groove or the second through-groove.

10. The gradient coil according to claim 7, wherein the coils each comprise a strand conductor that functions as the continuous current pathway along the contours in the coil planes.

11. The gradient coil according to claim 7, wherein the plurality of coils disposed so as to face each other are curved plate-shaped.

12. The gradient coil according to claim 11, comprising a linear region at a position offset from a center of a cylindrical void toward an end of the cylindrical void along a long axis of the cylindrical void, the linear region being a region in which a magnetic field intensity linearly changes, the cylindrical void being formed from the plurality of curved plate-shaped coils.

13. The gradient coil according to claim 12, wherein:
the plurality of curved plate-shaped coils disposed so as to face each other constitute a cross-sectionally gradient coil that generates a gradient magnetic field in a transverse section perpendicular to the long axis,
the continuous current pathway defines:
a substantially rectangular region that is disposed in a center of the coil planes, that is symmetrical with respect to the long axis, and that does not have the continuous current pathway, and
a substantially trapezoidal region that is disposed along the long axis together with the substantially rectangular region in the coil planes, that is symmetrical with respect to the long axis, and that does not have the continuous current pathway, and
the substantially rectangular region is located, among a short side and a long side of the substantially trapezoidal region, on a side of the long side.

14. The gradient coil according to claim 13, wherein the substantially rectangular region has:
a dimension in a direction of the long axis within a range of 10% to 15% of a dimension of an outline surrounded by the continuous current pathway, and
a dimension in a direction perpendicular to the long axis within a range of 16% to 22% of the dimension of the outline surrounded by the continuous current pathway,
the substantially trapezoidal region has:
a dimension in the direction of the long axis within a range of 10% to 15% of the dimension of the outline surrounded by the continuous current pathway,
a dimension of the short side in the direction perpendicular to the long axis within a range of 18% to 24% of the dimension of the outline surrounded by the continuous current pathway, and
a dimension of the long side in the direction perpendicular to the long axis within a range of 31% to 37% of the dimension of the outline surrounded by the continuous current pathway.

15. The gradient coil according to claim 14, wherein
gradient magnetic field efficiency in the transverse section is within a range of 135 to 145 µT/m/A,
inductance for direct current is within a range of 213 to 233 µH, and
a resistance value for direct current is within a range of 80 to 90 mΩ.

16. The gradient coil according to claim 12, further comprising a pair of axially gradient coils having a pair of continuous current pathways that generate a gradient magnetic field in the direction along the long axis, wherein
the pair of axially gradient coils are disposed symmetrically with respect to a center of the linear region along the long axis, and a direction of current is opposite between the axially gradient coils, and
the pair of continuous current pathways are disposed such that current density distribution along the long axis is bimodal at least in either one side or the other side of the center of the linear region.

17. The gradient coil according to claim 16, wherein an intensity of current density of a peak located far from the center of the linear region is 10 to 15 times an intensity of current density of a peak located closer to the center of the linear region in the current density distribution.

* * * * *